(12) United States Patent
Fujiyoshi

(10) Patent No.: US 9,678,191 B2
(45) Date of Patent: Jun. 13, 2017

(54) ELECTROSTATIC CAPACITANCE DETECTION CIRCUIT AND INPUT DEVICE

(71) Applicant: ALPS ELECTRIC CO., LTD., Tokyo (JP)

(72) Inventor: Tatsumi Fujiyoshi, Miyagi-Ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 349 days.

(21) Appl. No.: 13/949,676

(22) Filed: Jul. 24, 2013

(65) Prior Publication Data
US 2014/0035601 A1    Feb. 6, 2014

(30) Foreign Application Priority Data

Aug. 1, 2012  (JP) .................. 2012-171177
May 1, 2013   (JP) .................. 2013-096474

(51) Int. Cl.
*G01R 35/00*   (2006.01)
*G01R 27/26*   (2006.01)
*G06F 3/041*   (2006.01)

(52) U.S. Cl.
CPC ......... *G01R 35/00* (2013.01); *G01R 27/2605* (2013.01); *G06F 3/0418* (2013.01); *H03K 2217/960725* (2013.01)

(58) Field of Classification Search
CPC .... G01R 26/2705; G01R 35/00; G06F 3/0418
See application file for complete search history.

(56) References Cited

U.S. PATENT DOCUMENTS

| 6,452,514 | B1 | 9/2002 | Philipp |
| 2003/0222661 | A1* | 12/2003 | Fasen ........................... 324/662 |
| 2008/0222827 | A1* | 9/2008 | Veerasamy ................ 15/250.12 |
| 2010/0328226 | A1* | 12/2010 | Simmons ...................... 345/173 |
| 2011/0273400 | A1 | 11/2011 | Kwon et al. |
| 2011/0279407 | A1* | 11/2011 | Kim et al. .................... 345/174 |
| 2011/0279409 | A1* | 11/2011 | Salaverry et al. ............ 345/174 |

* cited by examiner

*Primary Examiner* — Jeff Natalini
(74) *Attorney, Agent, or Firm* — Brinks Gilson & Lione

(57) ABSTRACT

An electrostatic capacitance detection circuit includes a charge amplifier that has an operational amplifier in which a capacitor is provided on a feedback path, and into which a signal including detection of electric charge of an inter-electrode capacitor of a sensor electrode and electric charge due to an external noise, and a selection switch that can switch a direction of a capacitor that is connected to input and output terminals of the charge amplifier through a feedback path that switches the direction of the capacitor depending on a direction of electric charge flowing in from a detection-side electrode of the sensor electrode, due to a drive signal applied to the sensor electrode.

13 Claims, 20 Drawing Sheets

ELECTROSTATIC CAPACITANCE DETECTION CIRCUIT AND INPUT DEVICE

CLAIM OF PRIORITY

This application claims benefit of Japanese Patent Application No. 2012-171177 filed on Aug. 1, 2012 and No. 2013-096474 filed on May 1, 2013, which are hereby incorporated by reference in their entireties.

BACKGROUND

1. Field of the Disclosure

The present disclosure relates to an electrostatic capacitance detection circuit that detects a minute change in electrostatic capacitance on a sensor such as a touch pad and a touch sensor, and an input device.

2. Description of the Related Art

In the related art, there has been proposed an electrostatic capacitance detection circuit that is suitable for detecting a minute change in electrostatic capacitance between sensor electrodes in an input device such as a touch pad and a touch sensor in a noisy situation.

For example, the electrostatic capacitance detection circuit disclosed in Japanese Patent No. 4275865 employs a configuration in which, to detect mutual capacitance between sensor electrodes, electric charge transfer from the mutual capacitance is performed with respect to an integral capacitor at the timing for when a rising edge of a drive pulse occurs. Furthermore, in the electrostatic capacitance detection circuit disclosed in U.S. Unexamined Patent Application Publication No. 2011-0273400, a filtering effect on the noise with a low frequency is improved by performing the electric charge transfer from the mutual capacitance to two integral circuits at the timing for when both edges of the drive pulse occur.

Incidentally, inter-electrode capacitance (the mutual capacitance) between a drive electrode and a detection electrode that makes up a sensor is normally as small as several pF, but an amount of change due to finger's close proximity is smaller than this. That is, it is on the order of several hundred fF or less. For this reason, an influence of mixture noise is serious. Causes of the mixture noise, can be a noise from a power source of a system into which the touch pad and the touch sensor are built, a drive signal of a liquid panel inside the system and others, and an influence of these noise sources cannot be ignored due to the complexity of the apparatus and others.

In a case of the detection circuit disclosed in Japanese Patent No. 4275865, the electric charge transfer to the integral capacitor is performed only on the rising edge of the drive pulse. Because of this, when a noise is applied to a manipulation body, such as a finger, or the noise is applied to the system that detects the electrostatic capacitance, the noise is mixed into the electric charge that is transferred. When a frequency of the noise applied during an integral period is lowered, the averaging of the mixture noise is not sufficient during the integral period, and a larger influence of the noise on output data appears.

In the case of the detect circuit disclosed in U.S. Unexamined Patent Application Publication No. 2011-0273400, the electric charge transfer is performed on both of the edges of the drive pulse and thus the filtering effect on the noise with the low frequency is improved, but an integral circuit, using an operational amplifier, is necessary for two systems, and circuit scale and power consumption are caused to be increased.

SUMMARY

An electrostatic capacitance detection circuit includes an electric charge integral circuit into which a signal including detection electric charge of an inter-electrode capacitor of a sensor electrode and electric charge due to an external noise flows, and an A/D converter that converts an output of the electric charge integral circuit from an analog signal into a digital signal, in which the electric charge integral circuit includes a capacitor that accumulates the electric charge transferred between the capacitor and the inter-electrode capacitor, and continuously integrates the electric charge, transferred on each of a rising edge and a falling edge of a drive signal applied to an drive-side electrode of the sensor electrode, in the capacitor.

According to the electrostatic capacitance detection circuit, by continuously integrating the electric charge transferred on each of the rising edge and the falling edge of the drive signal in the capacitor, an external noise with a low frequency is averaged, and thus an influence of the external noise can be reduced. Furthermore, because the integral circuit for two systems is not used, the resistance to the external noise can be greatly improved with a minimum circuit configuration.

According to another aspect of the present invention, an input device includes a sensor electrode in which an X electrode group and a Y electrode group 4 that intersect each other at right angles are arranged into a matrix form, and an electrostatic capacitance detection circuit that detects a change in inter-electrode capacitance of the sensor electrode. The electrostatic capacitance detection circuit can employ any one of the configurations described above.

DESCRIPTION OF THE EXEMPLARY EMBODIMENTS

Figure 1:
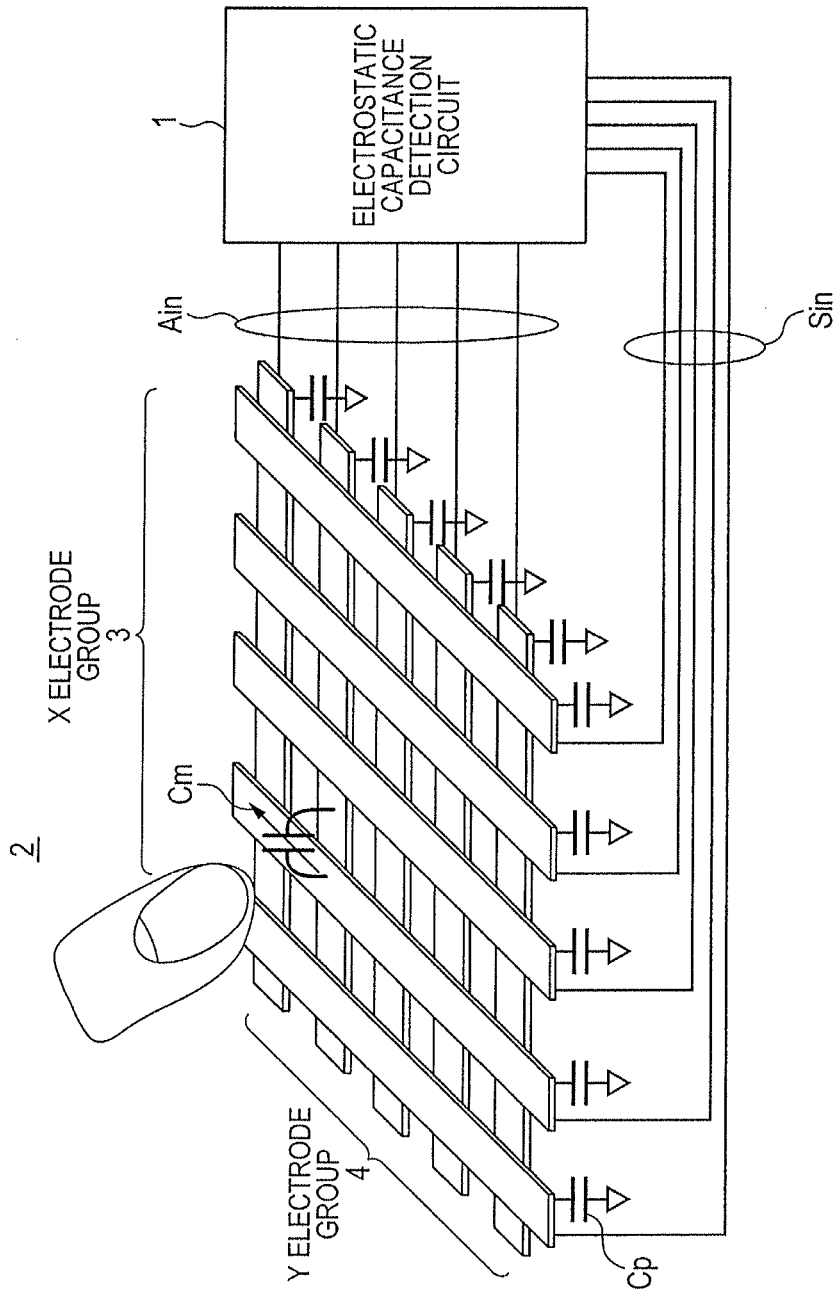
FIG. 1 is a diagram in which a sensor electrode is connected to an electrostatic capacitance detection circuit according to a first embodiment.

Embodiments of the present invention are described in detail below referring to the drawings.

First Embodiment

FIG. 1 illustrates a state in which a sensor electrode 2, such as a touch pad and a touch sensor is connected to an electrostatic capacitance detection circuit 1 according to the first embodiment. The sensor electrode 2 is formed on a two-dimensional plane and an X electrode group 3 and a Y electrode group 4 that intersect each other at right angles are arranged into a matrix form, in the sensor electrode 2. The arrangement of the X electrode group 3 and the Y electrode group 4 of the sensor electrode 2 in a matrix form makes it possible to detect a position that a human finger approaches.

In each electrode (an X electrode and a Y electrode) of the X electrode group 3 and the Y electrode group 4, a GND capacitor Cp with respect to a sealed substrate is present. Furthermore, an inter-electrode capacitor Cm, although illustrated only in one place in FIG. 1, is formed at each intersection point between the X electrode and the Y electrode. Because the inter-electrode capacitor Cm, when approached by the finger, decreases, the position that the finger approaches can be specified by detecting the electrostatic capacitance of each intersection point.

Figure 2:
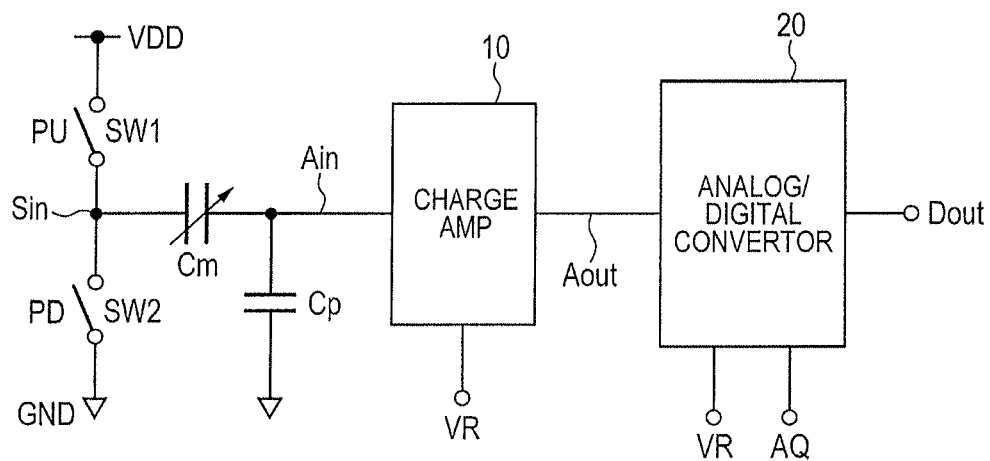
FIG. 2 is a block diagram of the electrostatic capacitance detection circuit that corresponds to an intersection point in which an inter-electrode capacitor is formed and a constituent portion of a corresponding sensor.

FIG. 2 is a block diagram illustrating a typical constituent portion (equivalent to the intersection point at which the inter-electrode capacitor Cm is formed) of a sensor, that is, one X electrode and one Y electrode, in FIG. 1 and the electrostatic capacitance detection circuit 1 that corresponds to the constituent portion of the sensor. With a node (a drive electrode node) Sin in a case where the X electrode in FIG. 1 is set to a drive electrode, and a node (a detection electrode node) Ain in a case where the Y electrode is set to a detection electrode, an amount of electric charge that depends on a size of the inter-electrode capacitor Cm is converted to a voltage with the charge amplifier 10, by assigning a drive signal, such as a square wave from the drive electrode node Sin. A switch SW1 that is ON/OFF controlled with a signal PU is provided to a voltage source VDD terminal of the drive electrode node Sin, and a switch SW2 that is ON/OFF controlled with a signal PD is provided to a GND terminal of the drive electrode node Sin.

Figure 3:
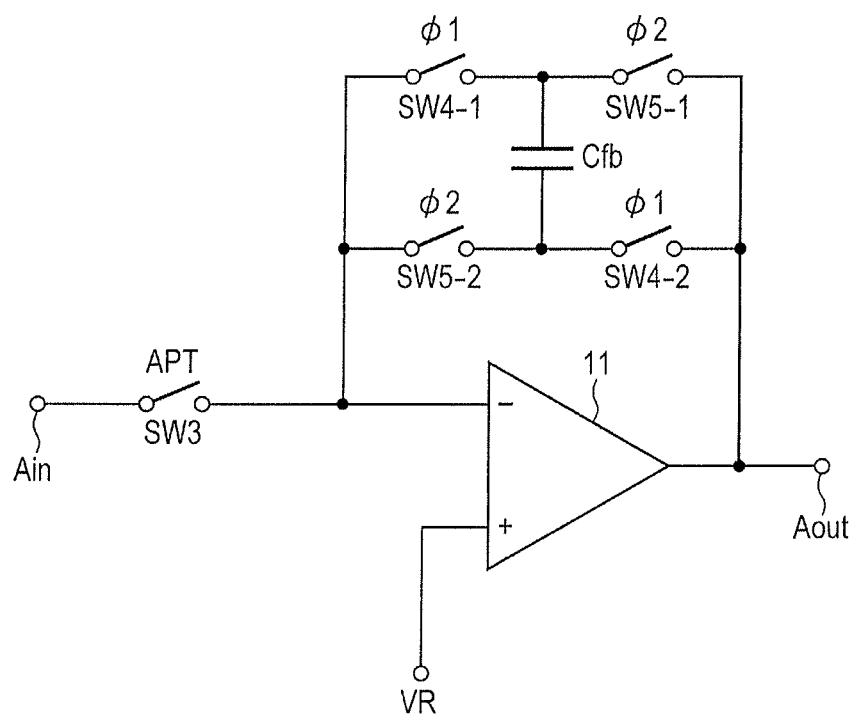
FIG. 3 is a diagram illustrating a specific configuration example of a charge amplifier according to the first embodiment.

FIG. 3 illustrates a specific configuration example of the charge amplifier 10. A catch switch SW3 that is ON/OFF controlled with a signal APT is provided in a series to a path of a negative input from the detection electrode node Ain to an operational amplifier 11 and a period during which a signal including an electric charge of the inter-electrode capacitor Cm and electric charge resulting from an external noise flows into the charge amplifier 10 is controlled. That is, the catch switch SW3 controls a period during which the electric charge flows into the charge amplifier 10. As a result, during an ON period, the signal including the electric charge flows into the charge amplifier 10 and thus an output of the charge amplifier 10 changes. During an OFF period, the signal including the electric charge stops flowing into the charge amplifier 10 and thus an output of the charge amplifier 10 is put on hold. By doing this, the control by the catch switch SW3 of the period during which the electric charge flows into the charge amplifier 10 makes it possible to exactly catch an analog signal that becomes an output of the charge amplifier 10, in accord with the timing of analog/digital conversion. A total of 4 switches, selection switches SW4-1 and SW4-2 that are ON/OFF controlled with a signal $\phi 1$ and selection switches SW5-1 and SW5-2 that are ON/OFF controlled with a signal $\phi 2$, are provided on a feedback path from the output of the operational amplifier 11 to the negative input. The selection switches SW4-1, SW5-1, SW4-2, and SW5-2 make up a selection circuit. The selection circuit makes it possible for two terminals of a feedback capacitor Cfb as a capacitor to be switch-connected in positive and reverse directions. Reference electric potential VR is connected to a positive input of the operational amplifier 11. The reference electric potential is set near the middle point of a power source of the operational amplifier 11 in such a manner as to accommodate a dynamic range of an output signal widely.

An output Aout of the charge amplifier 10 is input to an analog/digital converter 20 (refer to FIG. 2). A conversion timing stipulation signal AQ is input to the analog/digital converter 20 and a difference in electric potential between the output Aout and the reference potential VR is converted into a digital signal Dout, at the timing of rising of a signal AQ. That is, AD conversion is performed depending on the rising of the signal AQ in a state where the flowing of the signal including the electric charge into the charge amplifier 10 is controlled with the catch switch SW3, and when the catch switch SW3 is off, the output of the charge amplifier 11 is put on hold. This excludes an adverse influence of a noise filter effect.

Figure 4:
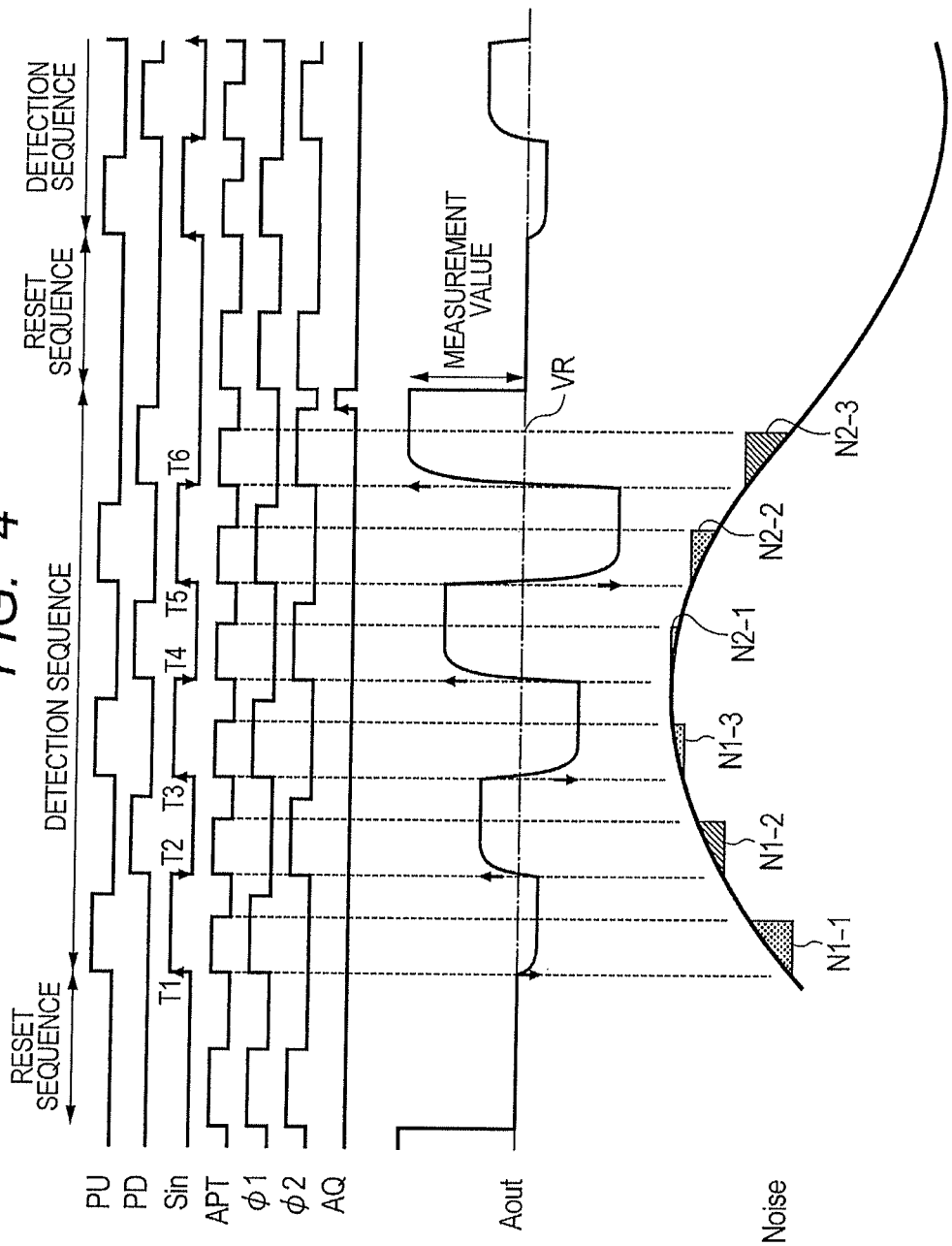
FIG. 4 is a timing chart for describing an operation of the first embodiment.

FIG. 4 is a timing chart illustrating an operation of the present embodiment. Signals PU and PD are signals that provide the drive electrode node Sin with the square wave by ON/OFF controlling each of the switches SW1 and SW2. When the signal PU is made ON and thus the switch SW1 is made ON, electric potential of VDD is set to the drive electrode node Sin. When the signal PD is made ON and thus the switch SW2 is made ON, electric potential of GND is set to the drive electrode node Sin. The signals PU and PD, which ON/OFF control the switches SW1 and SW2, are usually non-overlap signals (the ON periods do not overlap), but an inverter logic, which reverses a simple digital signal as it is, can be substituted for the switches SW1 and SW2.

T1 to T6 illustrate the timing of an edge of the drive signal and in this example, a voltage of an output Aout that results from integrating six times transfer of the electric charge introduced on both of the rising and falling edges is measured as the difference with the reference electric potential VR.

First, in a reset sequence, any signal of APT, φ1, and φ2 (the catch switch SW3, and the selection switches SW4-1, SW5-1, SW4-2, and SW5-2) are made ON and thus electric charge of the feedback capacitor Cfb is reset and the detection electrode node Ain is set to the reference electric potential VR. Next, each signal of APT, φ1, and φ2 (the catch switch SW3, and the selection switches SW4-1, SW5-1, SW4-2, and SW5-2) is made OFF and thus the reset sequence ends.

On the next timing T1, the signal PU is made ON and thus the switch SW1 is made ON. This makes the drive electrode node Sin transition to VDD and makes the signal APT and the signal φ1 ON. At this time, because the operational amplifier 11 retains electric potential of the negative input as the same electric potential as the reference electric potential VR through the feedback capacitor Cfb and thus performs a negative feedback operation, the output Aout becomes electric potential that drops from the reference electric potential VR, due to electric charge transferred from the sensor electrode 2. In a state where the external noise is not present, an electric potential change ΔAout in the output Aout due to each edge of the drive signal is obtained from an amount of electric charge that is transferred, as follows.

$$\Delta Aout = VDD \times Cm/Cfb \quad (1)$$

In FIG. 4, a length of an arrow at the timing of the change in the output Aout indicates a size of ΔAout. Next, the signal APT is made OFF and thus the catch switch SW3 is made OFF. This blocks exchange of electric charge between the sensor electrode 2 and the charge amplifier 10. Furthermore, the signals PU and φ1 are made OFF, and the switches SW1, SW4-1, and SW4-2 are made OFF.

On the next timing T2, in order to make the drive electrode node Sin transition to GND, the signal PD is made ON. Furthermore, the signal APT and the signal φ2 are made ON at the same time and thus the electric charge transfer in the direction opposite to the direction in a case of the timing T1 occurs between the sensor electrode 2 and the charge amplifier 10, but because connection to the feedback capacitor Cfb is in the direction opposite to the direction in a case of the signal φ1, and the change to the electric charge that is accumulated in the positive direction with respect to the reference electric potential VR is caused to occur, the change to the positive electric potential with respect to the reference potential VR is caused to occur.

After such an operation is further repeated from T3 to T6, the difference in electric potential between the output Aout of the charge amplifier 10 and the reference electric potential VR is analog/digital converted as an electrostatic capacitance measurement value at the timing of the rising edge of the signal AQ.

The size of the inter-electrode capacitor Cm is detected while repeatedly performing this series of the reset sequences and the detection sequences, but according to the present embodiment, even though the external noise is mixed, for an amount of noise electric charge that is temporarily adjacent and thus is introduced into the charge amplifier 10, noises N1-1, N1-2, and N1-3 and noises N2-1, N2-2, and N2-3 are offset against one another as illustrated on the lowermost part of FIG. 4. Because of this, the resistance of the detection circuit to the noise is greatly improved.

Furthermore, according to the present invention, the detection sequence is not limited to six times. In a range in which the electric potential that is output as the output Aout falls into a range of GND and VDD, or in a power source range at which the charge amplifier 10 operates, a noise reduction effect is accordingly increased by repeating the detection sequence as many times as possible. Furthermore, the noise reduction effect is further increased by performing the electric charge transfer on the rising of the drive signal the same number of times that the electric charge transfer on the falling is performed.

Figure 5:
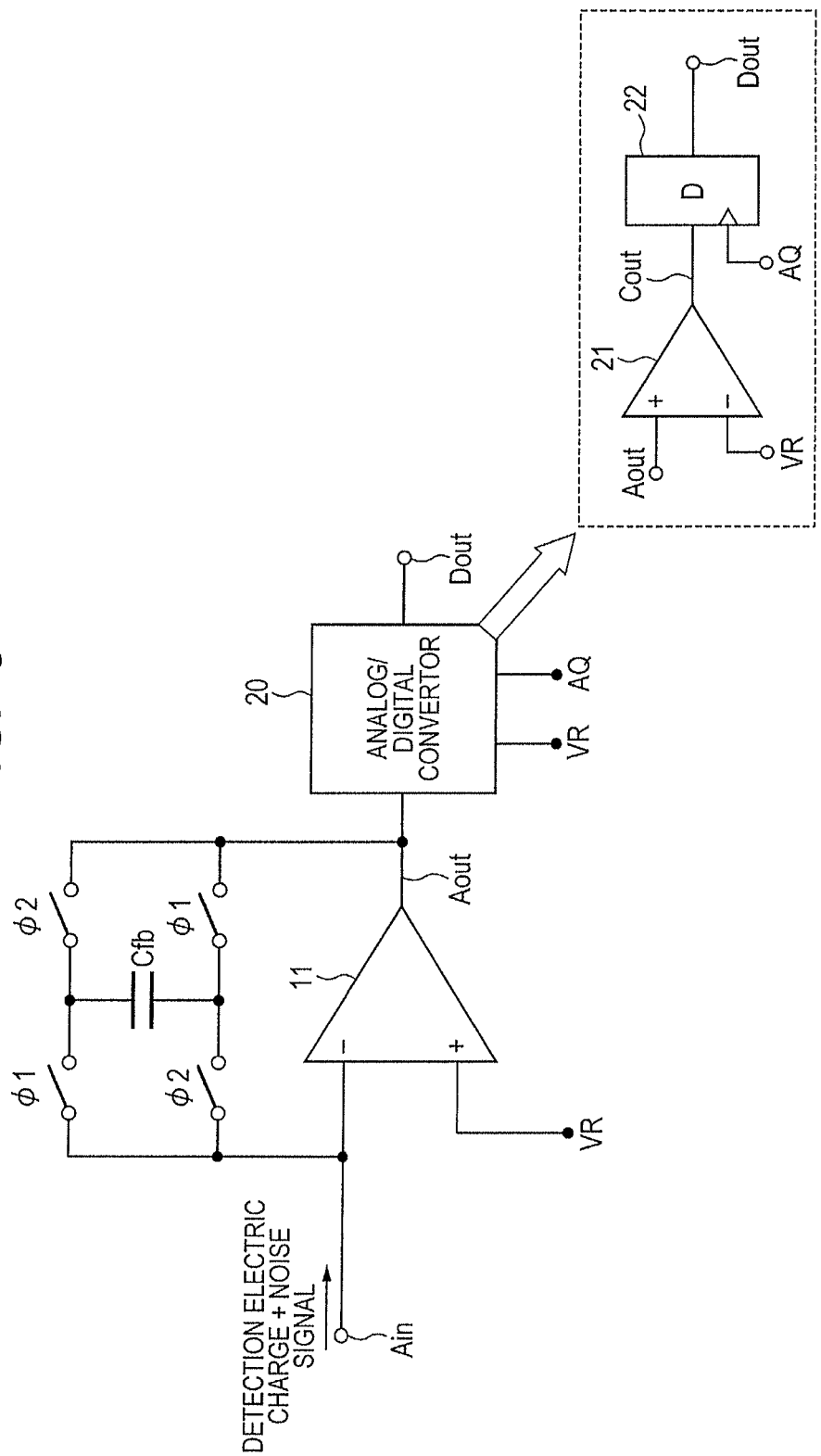
FIG. 5 is a diagram illustrating an internal configuration of an analog/digital converter.
Figure 6:
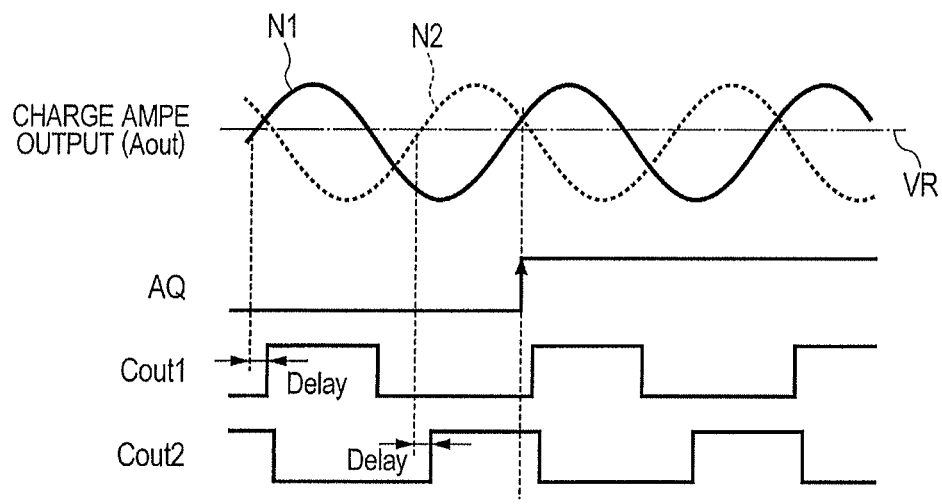
FIG. 6 is a diagram illustrating a relationship between an output in a case where an external noise is present and an output of a comparator.

The case is described in which the catch switch SW3, as means configured to catch the timing for when the analog signal of the charge amplifier 10 is converted into the digital signal, which is ON/OFF controlled with the signal APT, is introduced. However, here, a problem with a case where the catch switch SW3 (the signal ATP) is not introduced is described. Assume, for example, that the output Aout is connected to the analog/digital converter 20 without providing the catch switch SW3 that is ON/OFF controlled with the signal APT. Because most of the time the analog/digital converter 20 has a comparator inside, for example, the comparator in the analog/digital converter 20 is exemplified that outputs one bit. As illustrated in FIG. 5, an output of the comparator 21 is defined as Cout, and an output of a latch circuit 22 that latches the output Cout of the comparator 21 with the signal AQ is defined as Dout. A relationship between the output Aout and the output Cout of the comparator in a case where the external noise is present is illustrated in FIG. 6. For example, if it is assumed that a noise with a single frequency is mixed and thus a phase thereof is made different, then the output of the comparator is Cout 1 when the phase is N1, and the output of the comparator is Cout 2 when the phase is N2. The comparator 21 makes a comparison between the output Aout and the reference electric potential VR and thus generates a HIGH or LOW output, but time delay is actually present, and the delay like the one illustrated in FIG. 6 occurs. Even though the timing of the analog/digital conversion is stipulated with the timing of the signal AQ in which voltages of the output Aout are all the same with N1 and N2, the digital signal that is latched becomes a different value. As a result, an effect of filtering a noise out with the charge amplifier 10 is greatly decreased.

Figure 7A:
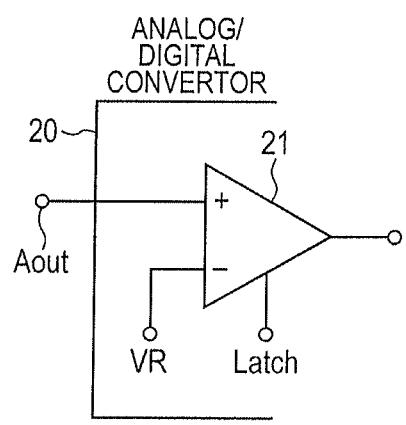
FIG. 7A is a diagram illustrating that the comparator itself retains a latch function.
Figure 7B:
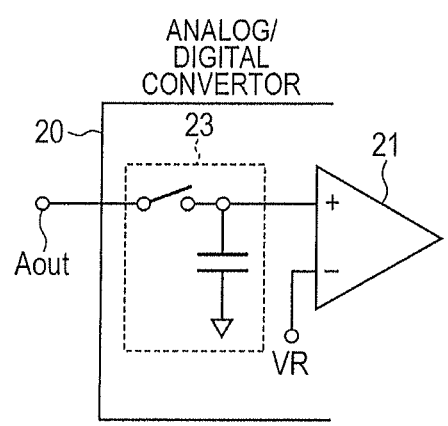
FIG. 7B is a diagram illustrating that a track/hold circuit is added to immediately before the comparator.

Thus, the catching of the analog signal with the catch switch SW3 (the signal APT) at the timing for when the output Aout is converted into the digital signal makes the original filtering effect accomplished. Even though the comparator 21 itself of the analog/digital convert 20 is made to have a latch function inside as illustrated in FIG. 7A and a track/hold circuit 23 receiving the output Aout is added to immediately before the comparator 21 as illustrated in FIG. 7B, the same effect can be obtained, as is the case with the switch SW3 that is controlled with the signal APT.

Second Embodiment

Next, a second embodiment that results from partly modifying the charge amplifier 10 is described.

Figure 8:
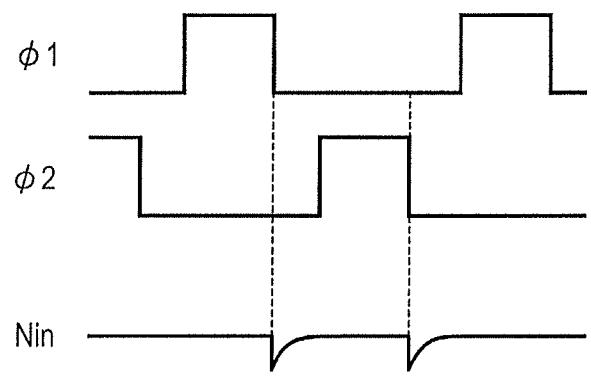
FIG. 8 is a diagram illustrating signals $\phi 1$ and $\phi 2$ that are non-overlap signals.
Figure 9:
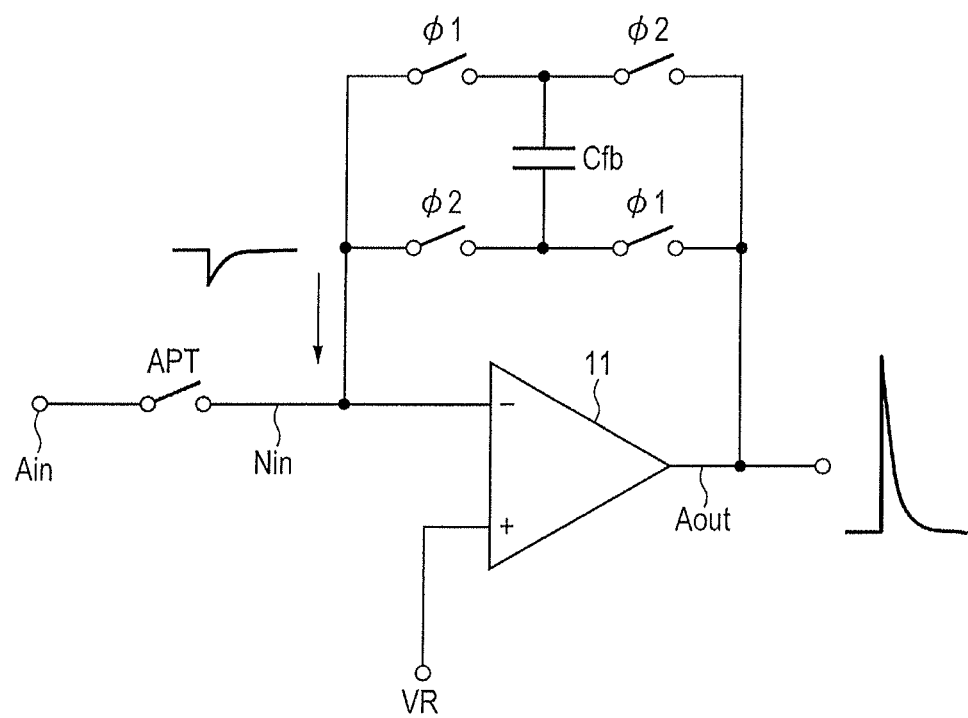
FIG. 9 is a diagram illustrating a situation under which a noise in the form of a spike is input when a feedback path is in an open state.

Because the selection circuit (the selection switches SW4-1, SW5-1, SW4-2, and SW5-2) is controlled with signals φ1 and φ2 is usually controlled in such a manner that the switches are not made ON mutually at the same time, the signals φ1 and φ2 are the non-overlap signals, as illustrated in FIG. 8. Furthermore, in the actual switch, there occurs an electrostatic capacitance coupling between a signal input and output unit through which the data signal is transmitted and is input/output with respect to the switch, and a control signal input unit to which a control signal controlling the switch is input. For example, when working out the design, a technique is employed in which a dummy transistor is provided in order to cancel the coupling thereof, but occasionally influence that cannot be negligible remains. In this case, as illustrated in FIG. 8 and FIG. 9, there is a likelihood that a noise Nin in the waveform of a spike will occur. Because during the period during which the signals φ1 and φ2 are together made OFF at the time of an occurrence of the noise, an open loop is caused without the negative feedback being set to be received from the operational amplifier 11, a great output change occurs in the output Aout. Deterioration in an SN ratio of the output of the charge amplifier occasionally occurs because when the signals φ1 to φ2 are made ON after this state, unnecessary electric charge flows into the feedback capacitor Cfb.

Figure 10:
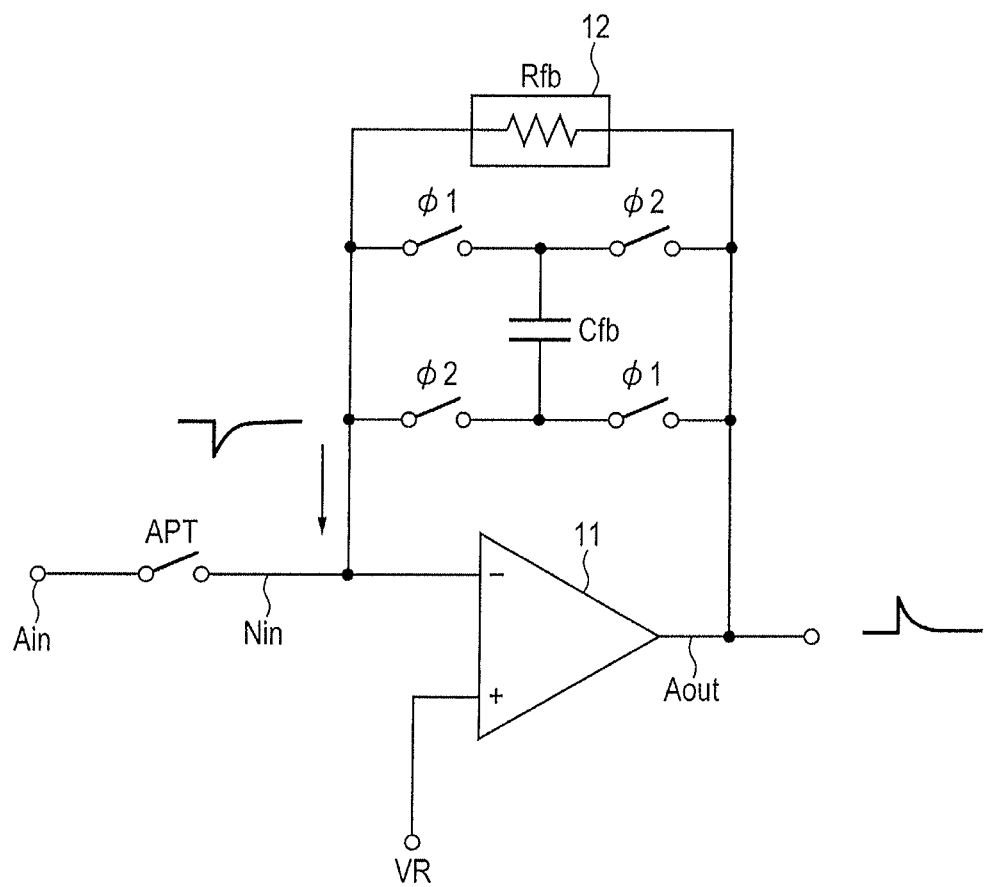
FIG. 10 is a diagram illustrating a specific configuration example of a charge amplifier according to a second embodiment.

Accordingly, the charge amplifier 10 applied to the second embodiment, as illustrated in FIG. 10, has a configuration in which a resistance element 12 with a resistor value Rfb is connected to the feedback path of the negative input and the output of the operational amplifier 11. In FIG. 10, like reference numerals are given to like parts of the charge amplifier 10 illustrated in FIG. 3. Even though the noise Nin in the waveform of a spike occurs in the charge amplifier 10 having this configuration, because a state is maintained in which negative feedback control from the output is always performed through the resistance element 12, the great change does not occur in the output Aout. Thus, the great deterioration in the SN ratio of the output Aout can be avoided. However, when Cfb×Rfb (time constant) is smaller than a sampling period, leakage of electric charge due to the resistance element 12 cannot be negligible. Thus, caution should be exercised, for example, to set Cfb×Rfb (time constant) to the extent to which influence of the leakage can be negligible.

Furthermore, the connection to the feedback path is not limited to the resistance element 12, an active element, such as a transistor and a diode, or a circuitry that is a combination of an impedance element and the active element may be used. For example, the use of a device that takes advantage of OFF characteristics of the transistor instead of the resistance element 12 can contribute to the shortening of a manufacturing process.

Third Embodiment

Next, a third embodiment of the present invention is described. According to the third embodiment, at the time of the rising edge of the drive electrode node Sin, the output Aout is sampled into a sampling capacitor Csn, and at the time of the falling edge of the drive electrode node Sin, the output Aout is sampled into a sampling capacitor Csp.

Figure 11:
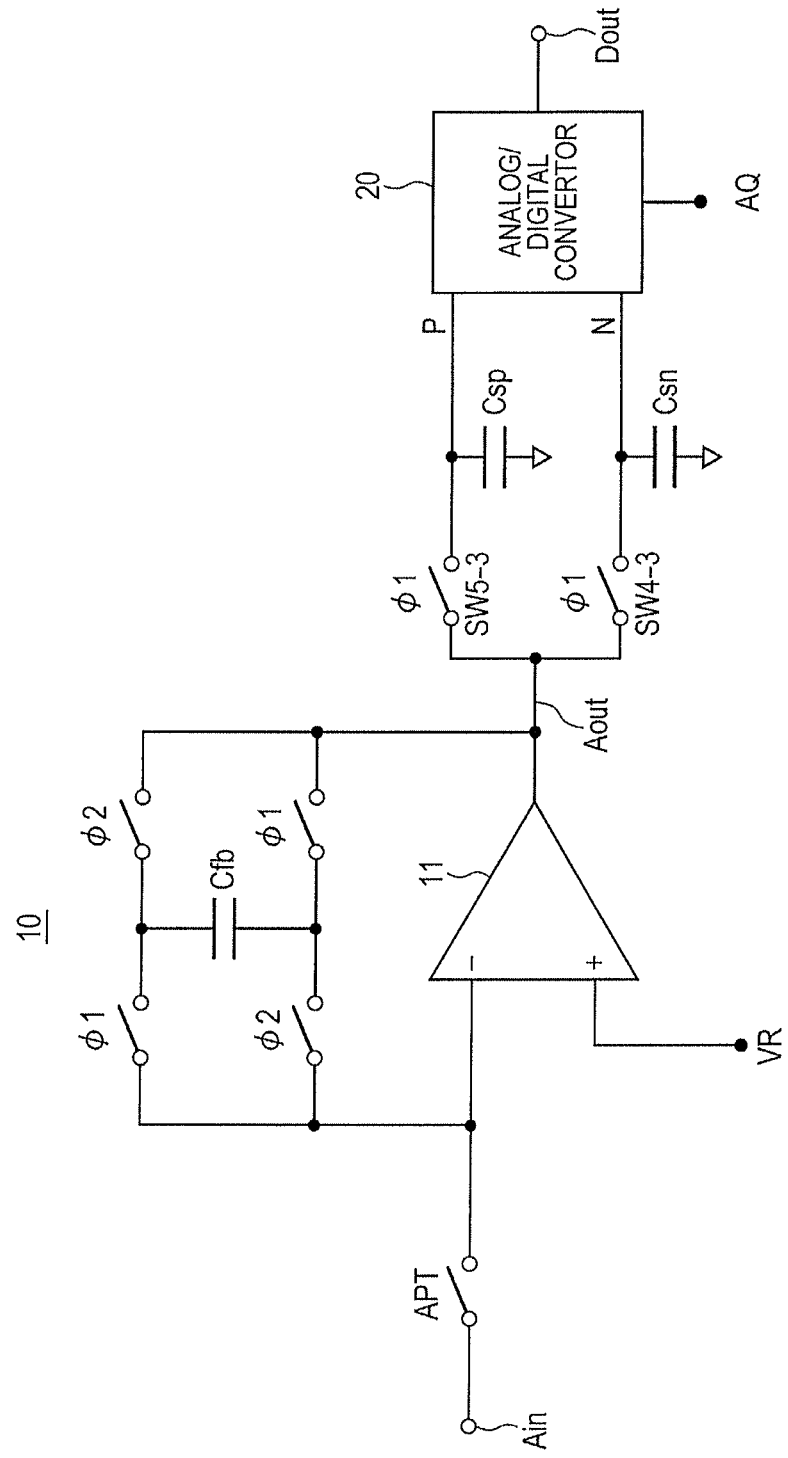
FIG. 11 is a diagram illustrating configurations of the charge amplifier and an analog/digital converter that are applied to the third embodiment.

FIG. 11 illustrates configurations of the charge amplifier 10 and the analog/digital converter 20 that are applied to the present third embodiment. In FIG. 11, like reference numerals are given to like parts of the charge amplifier 10 illustrated in FIG. 3. The sampling capacitor Csn is connected to a negative input N of the analog/digital converter 20, and the output Aout of the operational amplifier 11 is output through the switch SW4-3 that is controlled with the signal φ1. Furthermore, the sampling capacitor Csp is connected to a positive input P, and the output Aout of the operational amplifier 11 is output through the switch SW5-3 that is controlled with the signal φ2.

Figure 12:
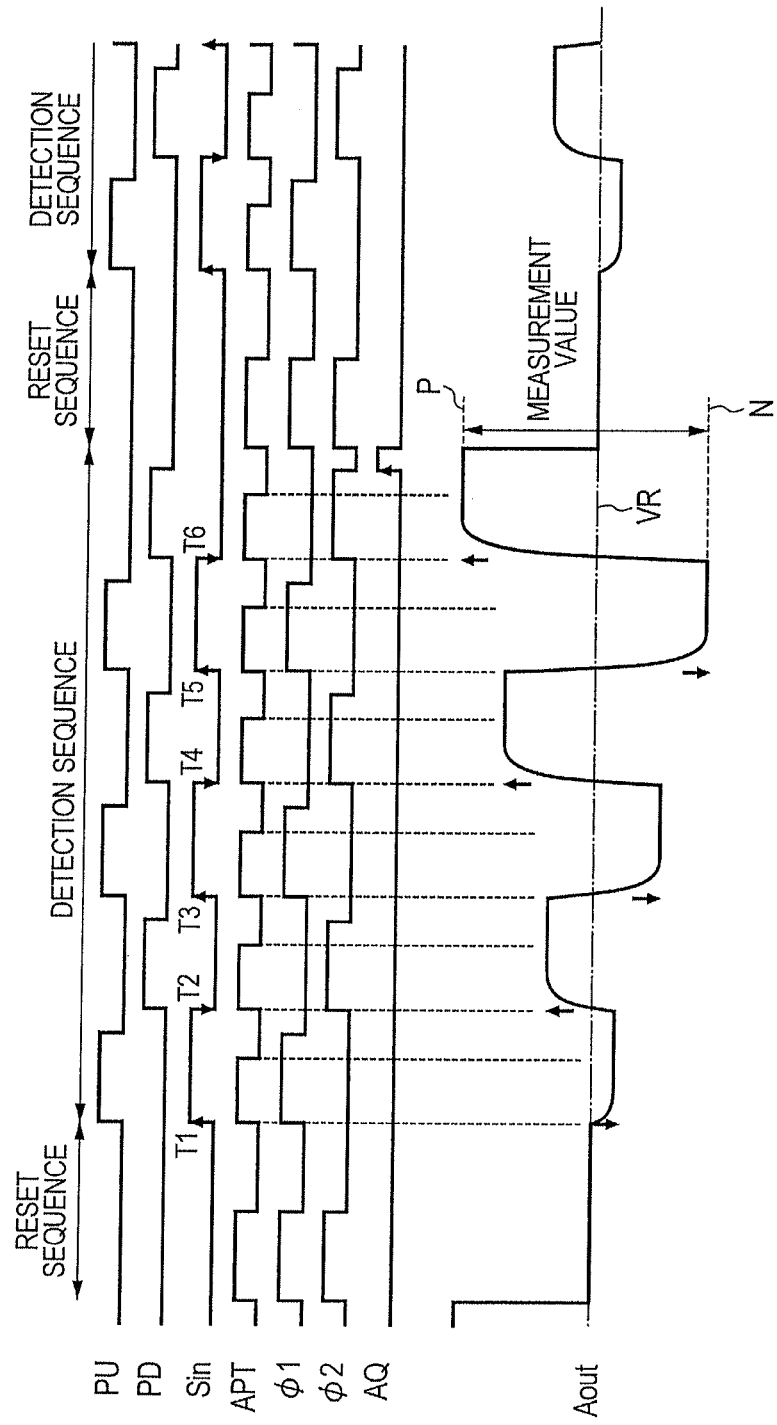
FIG. 12 is a timing chart for describing an operation of the third embodiment.

FIG. 12 is a timing chart for describing an operation of the third embodiment. Descriptions of the same parts as in FIG. 4 are omitted. In the control of the switches SW4-3 and SW5-3, which distributes the output Aout of the operational amplifier 11 to the sampling capacitor Csn and the sampling capacitor Csp, the setting to a shorter period than the signals φ1 and φ2, not the signals φ1 and φ2 can substitute a function of the catch switch SW3 (APT).

In the present example, an integral operation is performed at the timing T1 to T6. However, the negative output of the charge amplifier is accumulated in the sampling capacitor Csn at the timing T1, T3, and T5, and the positive output of the charge amplifier is accumulated in the sampling capacitor Csp at the timing T2, T4, and T6. When performing the analog/digital conversion in the last detection sequence, a difference (P−N) in electric potential between the sampling capacitor Csn and the sampling capacitor Csp is defined as a measurement value.

For this reason, the dynamic range of the output of the charge amplifier can be effectively used, and doubled output as the analog signal can be obtained. Therefore, the SN ratio can be further improved with the addition of a few circuit elements. Furthermore, because targets that the comparator 21 has to compare are a voltage with positive polarity P and a voltage with negative polarity N, and because the noise with a low frequency is converted into a common mode, the noise filter effect can be obtained in terms of both an integral effect and a difference effect.

Fourth Embodiment

Next, a fourth embodiment of the present invention is described. The present fourth embodiment is an embodiment that results from realizing a delta sigma type analog/digital converter, as the digital/analog converter 20, which uses the comparator 24 that outputs one bit.

Figure 13:
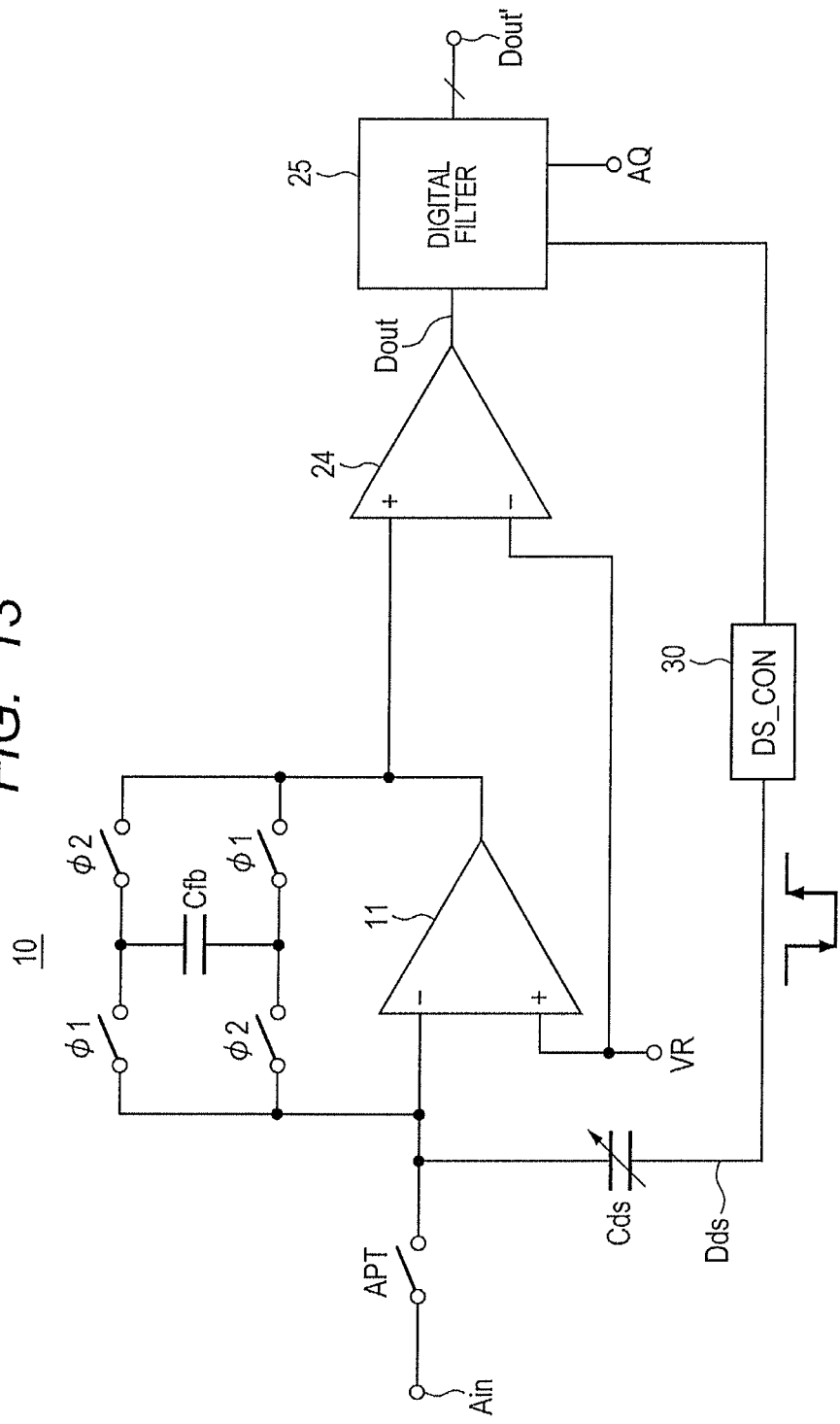
FIG. 13 is a block diagram of an electrostatic capacitance detection circuit according to a fourth embodiment.

FIG. 13 is a block diagram illustrating an electrostatic capacitance detection circuit according to the fourth embodiment. The analog/digital converter 20 is the delta sigma type analog/digital converter that is configured from a comparator 24 that outputs one bit, and a digital filter 25. Delta sigma modulation is performed by feeding back an output of the comparator 24 to an input, through a delta sigma feedback capacitor Cds. The feedback timing of the delta sigma feedback capacitor Cds is controlled with a delta sigma feedback control logic 30.

Figure 14:
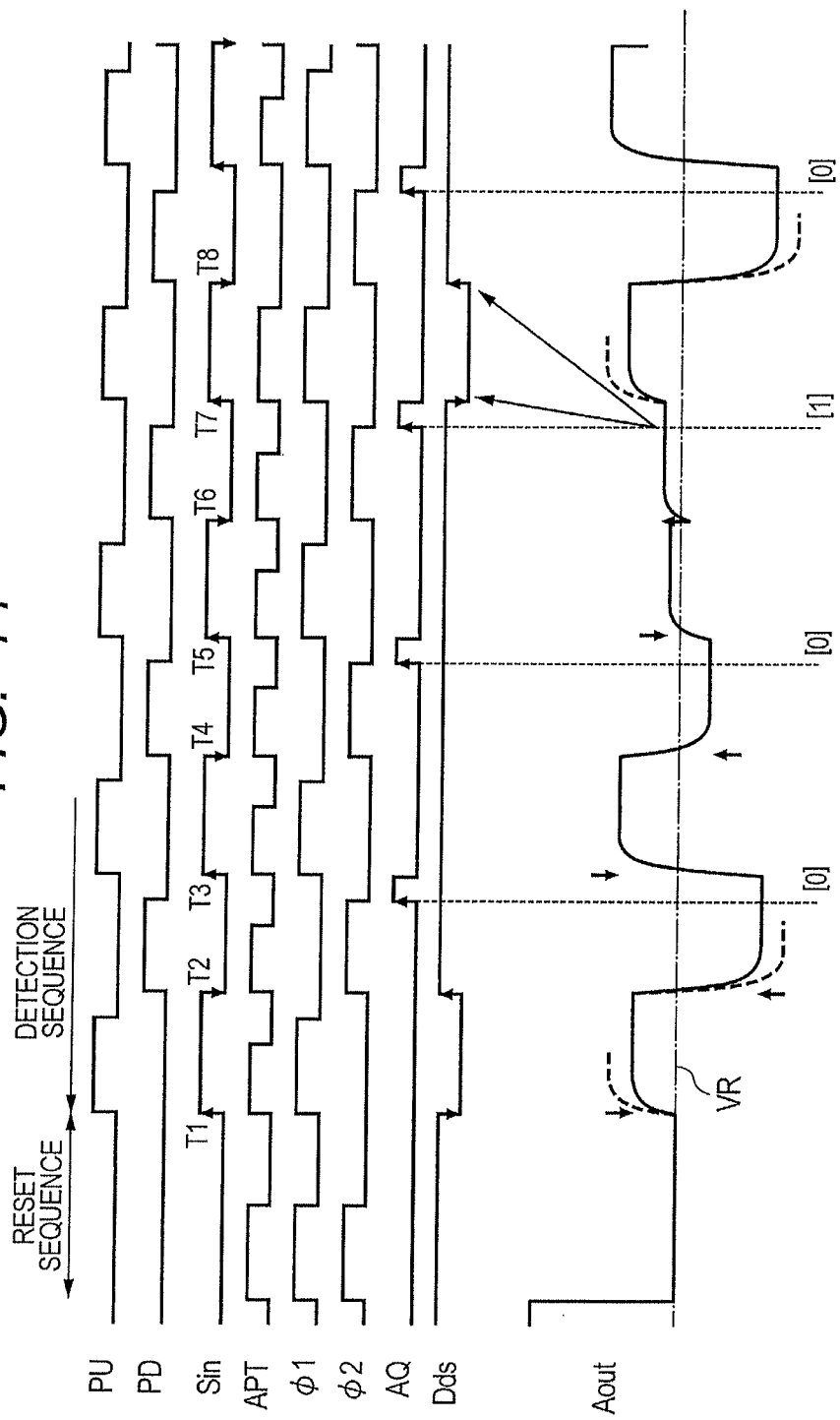
FIG. 14 is a timing chart for describing an operation according to the fourth embodiment.

FIG. 14 is a timing chart illustrating an operation of the fourth embodiment. Moreover, operations of generating the drive signal and introducing electric charge from the sensor electrode into the charge amplifier 10 with the control signals APT, φ1, and φ2 are the same as those according to the first embodiment.

In the reset sequence, steps involving up to the resetting of the electric charge of the feedback capacitor Cfb by making ON the selection switches SW4-1, SW5-1, SW4-2, and SW5-2 with the signals φ1 and φ2 are the same as those according to the first embodiment. In the integral operation on both of the rising and falling edges of the first drive signal at the timing T1 and T2, which is subsequently performed, initial electric charge is transferred to the feedback capacitor Cfb by changing a signal Dds in the direction opposite to the direction of the drive signal. At this time, the transfer of the electric charge is also performed at the same time, with the drive signal generated in the drive electrode node Sin. When the extent of the change of Dds is defined as the same VDD as in the drive signal, initial electric charge Qds that corresponds to one edge of the signal Dds, which is transferred to the feedback capacitor Cfb through the delta sigma feedback capacitor Cds, due to a change in the signal Dds, is expressed as follows.

$$Qds = VDD \times Cds \qquad (2)$$

In FIG. 14, an output waveform of the output Aout that corresponds to an amount of electric charge thereof is indicated by a dashed line, but because a size of Qds is normally set in such a manner as to be greater than that of electric charge (VDD×Cm) corresponding to the inter-electrode capacitance, the electric charge is deducted in the direction of an arrow with the transfer electric charge due to the drive signal and thus the waveform is indicated by a solid line. Because, on both of the edges at the timing T1 and T2, the initial electric charge is transferred to the feedback capacitor Cfb, a total of doubled electric charge in Expression (2) is transferred as the initial electric charge to the feedback capacitor Cfb.

Because the electric charge that corresponds to the inter-electrode capacitor Cm is transferred with the drive signal on the edges at the timing T1 to T5, the electric charge is transferred in the state of being deducted from the initial electric charge of the feedback capacitor Cfb, and the output of the charge amplifier approaches the reference electric potential. The signal AQ rises after the electric charge transfer is completed with the rising and falling edges of the drive signal as the unit, and thus a comparison result signal (one bit) that shows a result of comparing the output Aout and the reference electric potential VR, while being introduced into the digital filter 25, is converted into a multi bit output Dout' with digital filtering processing using a FIR filter and the like and then the result of the conversion is output. A value that is obtained by the digital filter 25 latching the result 0 or 1 of the comparison by the comparator 24 with the signal AQ is illustrated on the lower part of the output Aout in FIG. 14.

When the output Aout is increased more than the reference electric potential VR after the electric charge is transferred on the drive edge at the timing T6, the digital filter 25 latches "1" at the timing of the rising of the signal AQ on which the output of the comparator 24 is HIGH. Then, information thereon is transmitted to the delta sigma feedback control logic 30 and the signal Dds is fed back as a feedback signal of delta sigma modulation at the timing T7 and T8 of the edge of the next drive signal. The electric charge transfer due to the signal Dds at this time is also performed by using both of the edges of Dds in the same manner as the initial electric charge transfer. Furthermore, a gain of the output digital value can be adjusted by changing the size of the delta sigma feedback capacitor Cds.

The electrostatic capacitance detection circuit including the analog/digital converter with high resistance to the noise can be configured with such a simple configuration that as in the series of operations, the electric charge integral operation is performed in the state where the electric charge that depends on the size of the inter-electrode capacitor Cm is deducted with the drive signal from the initial electric charge VDD×Cds×2, and through the delta sigma feedback capacitor Cds, the electric charge that depends on a capacitance value thereof feeds back the result of the output by the comparator 24.

Fifth Embodiment

Next, a fifth embodiment of the present invention is described. The present fifth embodiment is an embodiment that results from realizing a delta sigma type analog/digital converter, as the analog/digital converter 20, which uses the comparator 24 that outputs one bit. Because the fifth embodiment is the same as the fourth embodiment in terms of the basic configuration and operation, here, only what is distinguishable from the fourth embodiment is mainly described.

Figure 15:
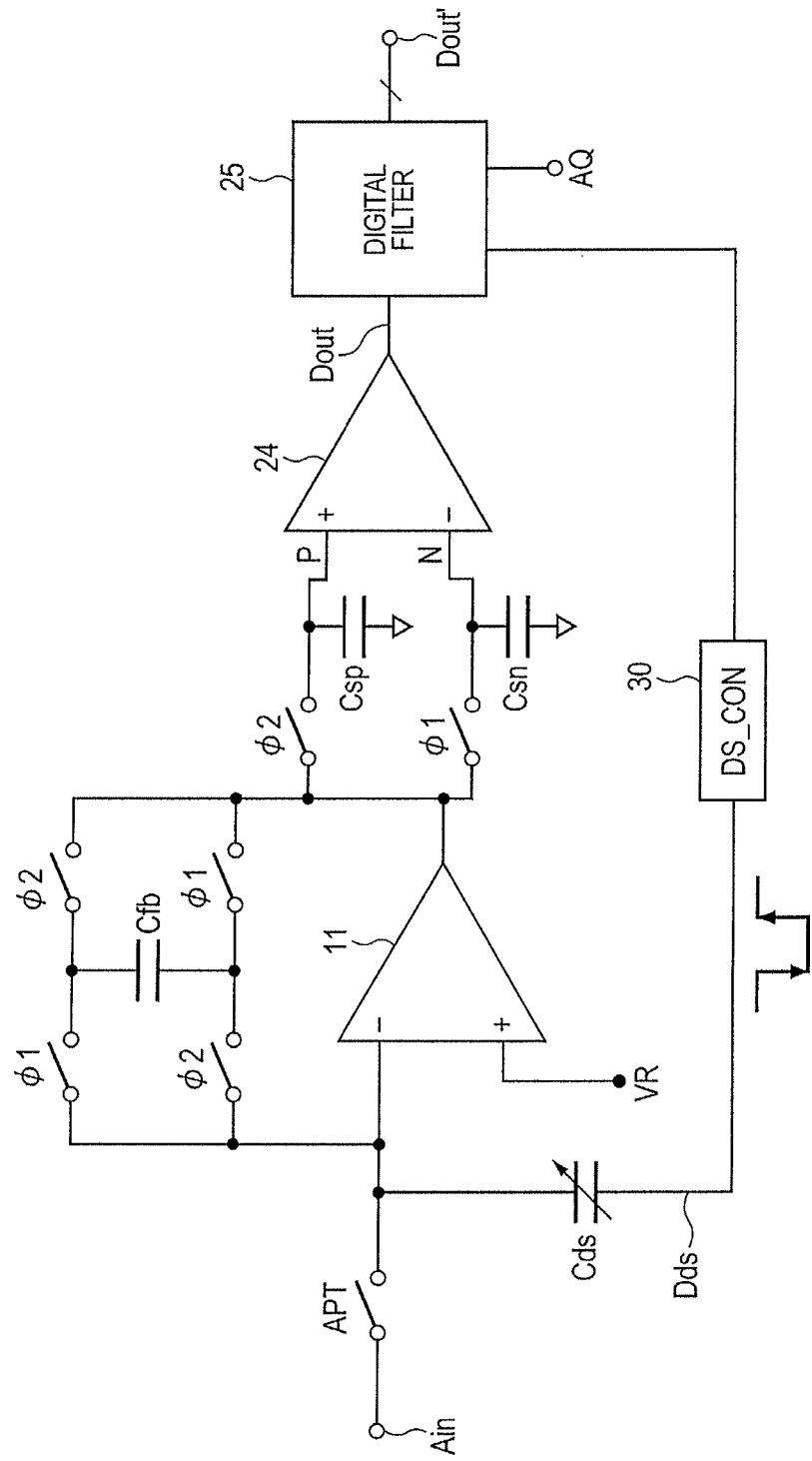
FIG. 15 is a configuration diagram of an electrostatic capacitance detection circuit according to a fifth embodiment.

FIG. 15 is a configuration diagram illustrating of an electrostatic capacitance detection circuit according to the fifth embodiment. Like reference numerals are given to like part of the electrostatic capacitance detection circuit illustrated in FIG. 11 and FIG. 13.

The input of the comparator 24 has a configuration in which the output Aout is sampled into the sampling capacitor Csn at the time of the rising edge of the drive electrode Sin, and the output Aout is sampled into the sampling capacitor Csp at the time of the falling edge of the drive electrode node Sin. Therefore, after the falling edge of the drive signal, the negative input (electric potential of Csn) of the comparator 24 is compared with the positive input (electric potential of Csp), and the delta sigma modulation is performed by using the result of the comparison.

Figure 16:
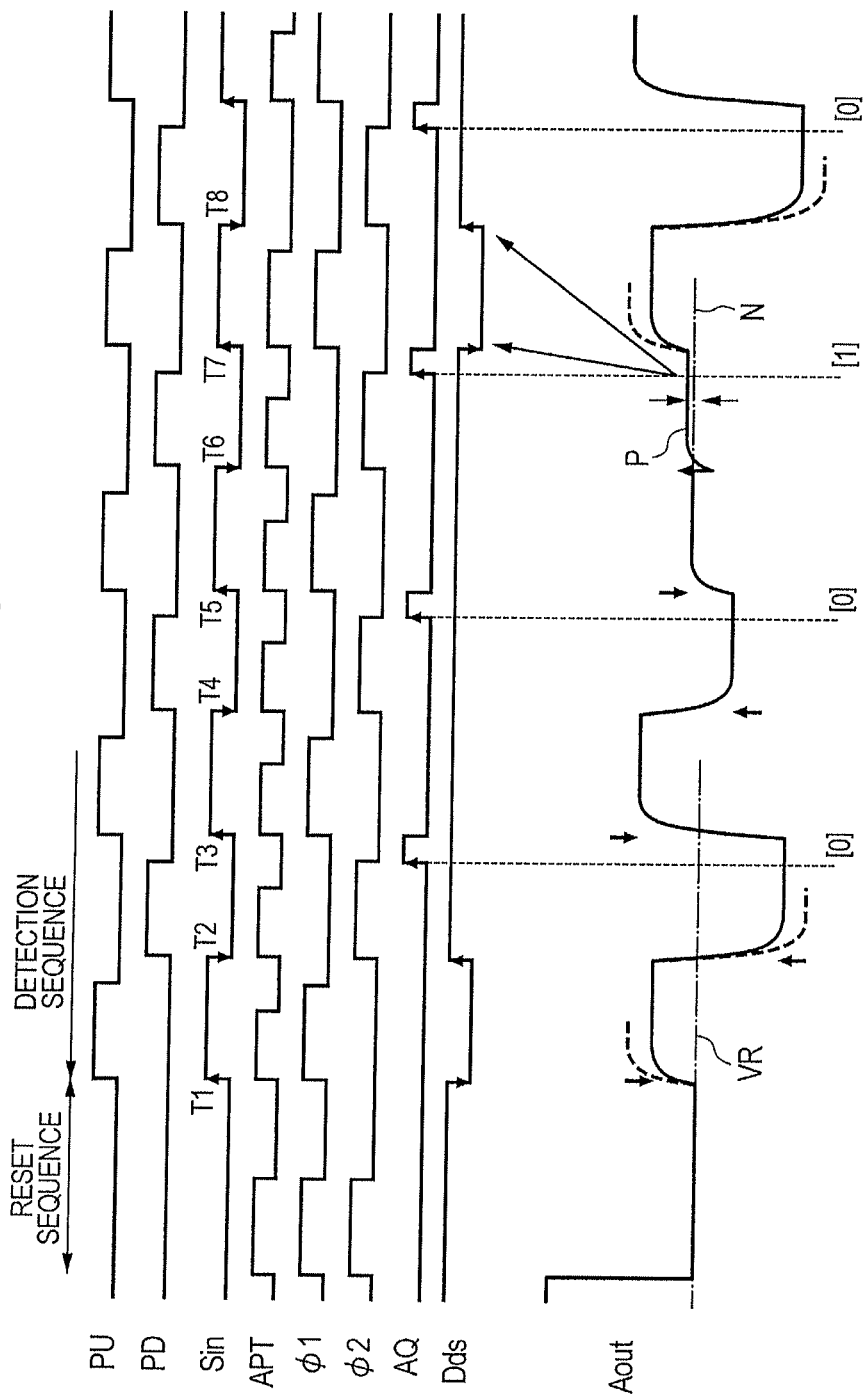
FIG. 16 is a timing chart for describing an operation of the fifth embodiment.

In the timing chart in FIG. 16, in the input of the comparator 24 after the falling edge of the drive signal at the timing T6, when negative input N<positive input P, the result of the comparison "1" is transmitted to the digital filter 25, and a delta sigma feedback operation is performed through the delta sigma feedback control logic 30 and the delta sigma feedback capacitor Cds.

In this case, as in the third embodiment, since the targets that the comparator 24 has to compare are voltages P and N, and since the noise with the low frequency is converted into the common mode, the noise filter effect resulting from both of the integral effect and the difference effect can be obtained, and the electrostatic capacitance detection circuit including the analog/digital converter with the high resistance to the noise can be configured with a simple configuration.

Sixth Embodiment

An electrostatic capacitance detection circuit according to a sixth embodiment, like the electrostatic capacitance detection circuit 1 illustrated in FIG. 1, is connected to the X electrode group 3 and the Y electrode group 4 that make up the sensor electrode 2, and thus detects the amount of electric charge that depends on the size of the inter-electrode capacitor Cm that is formed in each intersection point between the X electrode and the Y electrode, in order to specify the position that the finger approaches.

Figure 17:
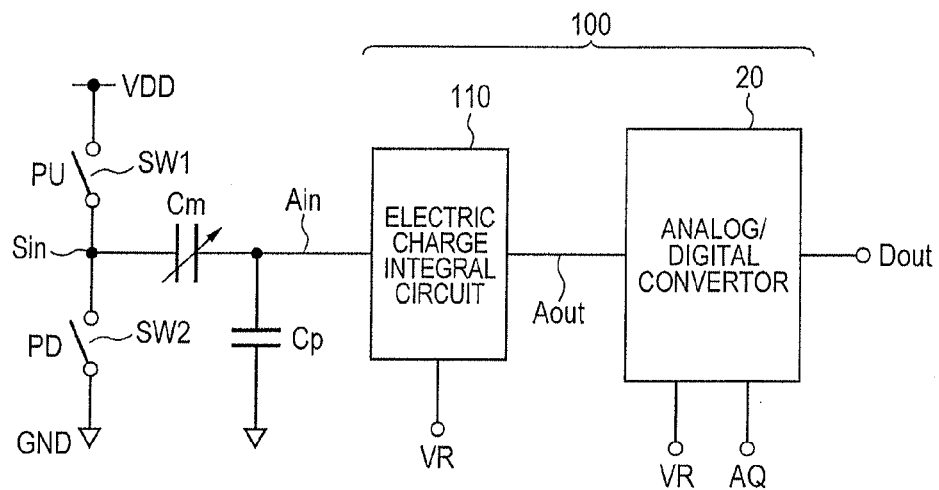
FIG. 17 is a block diagram of an electrostatic capacitance detection circuit according to a sixth embodiment.

FIG. 17 is a block diagram illustrating the typical constituent portion (equivalent to the intersection point at which the inter-electrode capacitor Cm is formed) of a sensor, that is, one X electrode and one Y electrode, in FIG. 1, and an electrostatic capacitance detection circuit 100 that corresponds to the constituent portion of the sensor. The X electrode in FIG. 1 is set to the drive electrode and the Y electrode is set to the detection electrode and the drive signal such as the square wave from the drive electrode node Sin is provided, and thus the amount of electric charge that depends on the size of the inter-electrode capacitor Cm is detected with an electric charge integral circuit 110.

Figure 18:
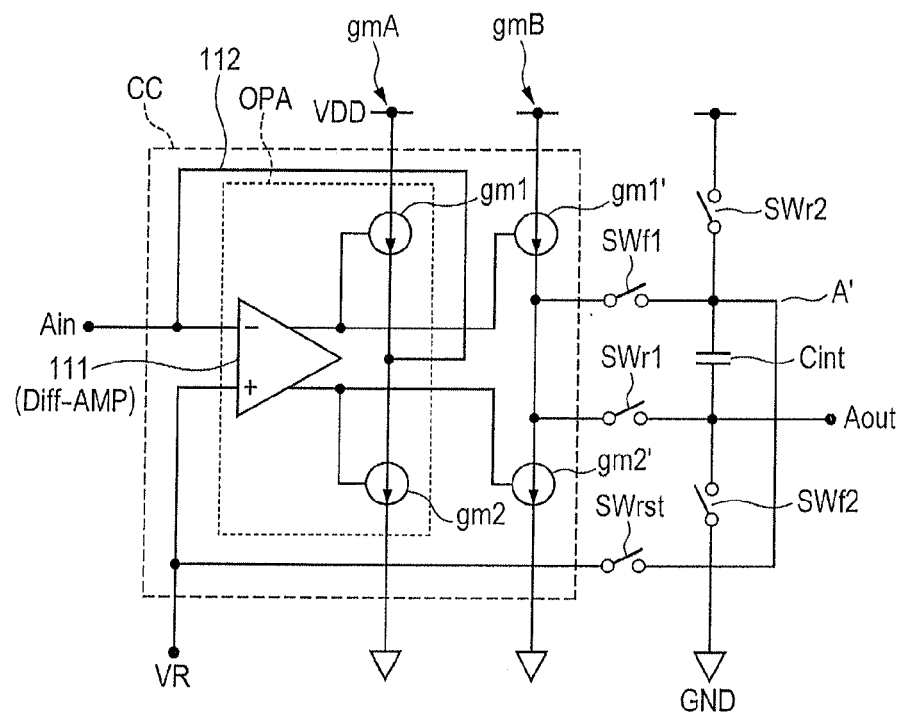
FIG. 18 is a configuration example of an electric charge integral circuit according to the sixth embodiment.

FIG. 18 illustrates a specific configuration example of the electric charge integral circuit 110. The electric charge integral circuit 110 includes a differential amplifier 111, a first electric current output circuit gmA (gm1 and gm2), a second electric current output circuit gmB (gm1' and gm2') that makes up a current mirror configuration, in company with the first electric current output circuit gmA, an integral capacitor Cint connected to an output of the second electric current output circuit gmB, and switches SWf1, SWf2, SWr1, SWr2, and SWrst through which terminals of both ends of the integral capacitor Cint are selectively connected to the output of the second electric current output circuit gmB and VDD (voltage power source), GND (ground), and VR (reference electric potential). The switches SWf1, SWf2, SWr1, SWr2, and SWrst make up a selection circuit. A circuit block that is made from the differential amplifier 111 and the first electric current output circuit gmA is generally called an operational amplifier OPA, and a circuit block, a combination of the operational amplifier OPA and the second electric current output circuit gmB, is called an electric current conveyor circuit CC.

In an example illustrated in FIG. 18, in the operational amplifier OPA, the detection electrode node Ain is connected to a negative input of the differential amplifier 111, and the reference electric potential VR is connected to a positive input. The reference electric potential VR is generally set near the middle point of the power source of the operational amplifier OPA in such a manner as to accommodate the dynamic range of the output signal widely, but in the present example, the reference electric potential VR is defined as a middle point voltage of the power source. The first electric current output circuit gmA and the second electric current output circuit gmB are connected to an output terminal of the differential amplifier 111. The first electric current output circuit gmA is configured from two transconductance elements gm1 and gm2 that are connected in series between the voltage power source VDD and the ground GND. The transconductance elements gm1 and gm2 each have, for example, MOS transistor constructions, and drain electric current changes depending on the voltage applied between a gate and a source. The transconductance elements gm1 and gms2 are controlled by using a first output and a second output that change in a complementary manner, depending on the electric potential difference between the positive input and the negative input of the differential amplifier 111. Thus, a function of performing voltage/electric current conversion is realized with the operational amplifier OPA. A middle connection point between the transconductance elements gm1 and gm2 is connected to the negative input of the differential amplifier 111 through a negative feedback path 112. Furthermore, the second electric current output circuit gmB is configured from two transconductance elements gm1' and gm2' that are connected in series between the voltage power source VDD and the ground GND. The transconductance elements gm1' and gm2' each have, for example, the MOS transistor constructions, and the drain electric current changes depending on the voltage applied between the gate and the source. The transconductance elements gm1 and gm1' are controlled with the first output of the differential amplifier, and the transconductance elements gm2 and gm2' are controlled with the second output of the differential amplifier. That is, the second electric current output circuit gmB makes up the current mirror configuration, in company with the first electric current output circuit gmA, and a current mirror ratio between the first electric current output circuit gmA and the second electric current output circuit gmB can be adjusted. The resistance to the noise can be improved without making larger the size of the integral capacitor Cint, by adjusting the current mirror ratio in such a manner that the integral capacitor Cint is not saturated due to the external noise. One terminal of the integral capacitor Cint is configured in such a manner that the one terminal can be connected to the middle connection point (an output of the electric current conveyor circuit CC) between the transconductance element gm1' and the transconductance element gm2' through the switch SWf1, and the other terminal is configured in such a manner that the other terminal can be connected through the switch SWr1. Furthermore, one terminal of the integral capacitor Cint is connected to the voltage power source VDD through the switch SWr2, and the other terminal is connected to the ground GND through the switch SWf2. Moreover, one terminal of the integral capacitor Cint is configured in such a manner that the one terminal is connected to the reference electric potential VR through the switch SWrst. A voltage that appears at the other terminal of the integral capacitor Cint is the output Aout of the electric charge integral circuit 110.

As illustrated in FIG. 17, the output Aout of the electric charge integral circuit 110 is input to the analog/digital converter 20. The analog/digital converter 20 converts the difference in electric charge between the output Aout of the electric charge integral circuit 110 and the reference electric potential VR into the digital signal Dout, at the timing of the rising of the signal AQ that becomes the conversion timing stipulation signal.

Figure 19:
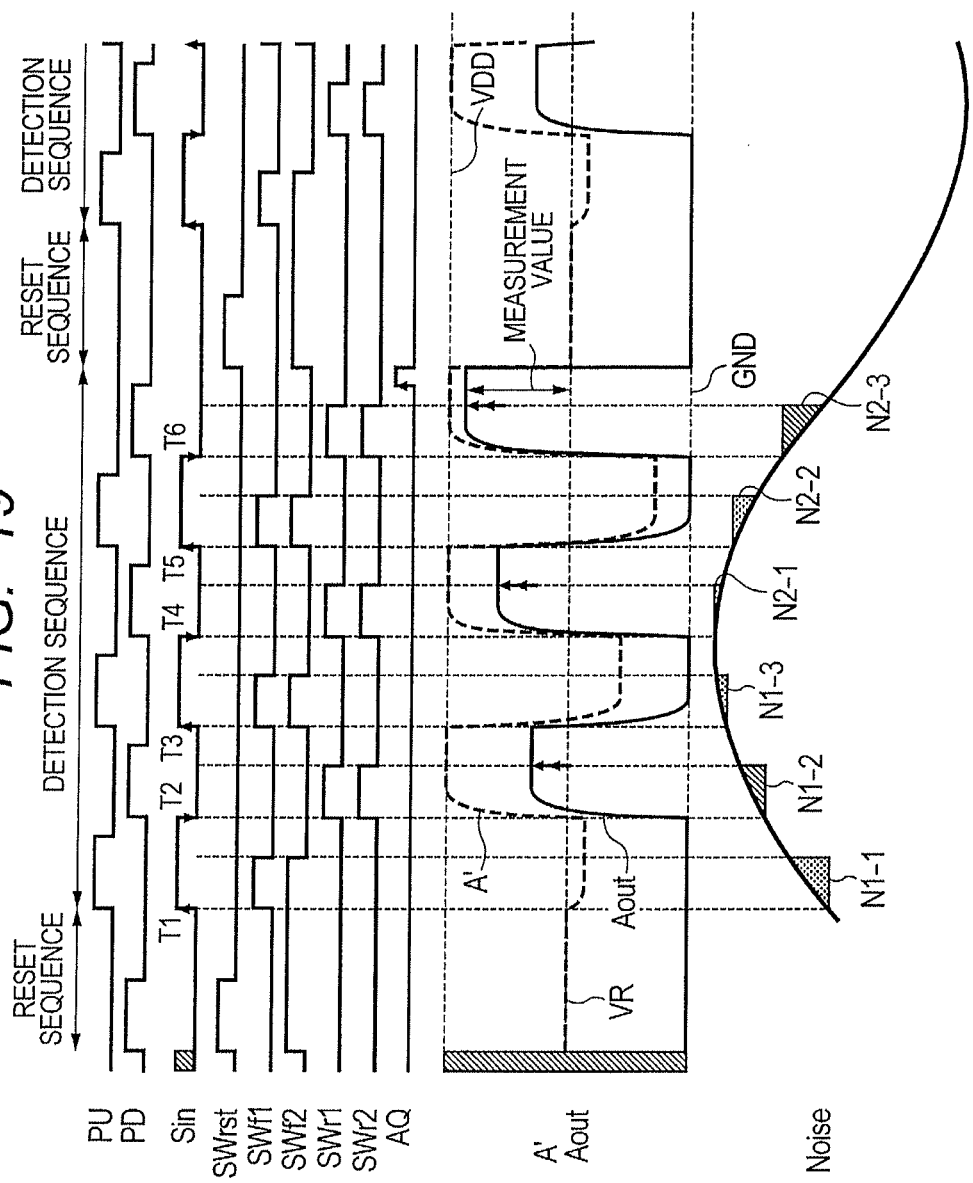
FIG. 19 is a diagram illustrating a timing chart for describing an operation of the sixth embodiment.

FIG. 19 is a timing chart illustrating operation timing when using the electric charge integral circuit 110 illustrated in FIG. 18. As in the timing chart illustrated in FIG. 4, each of the switches SW1 and SW2 that are ON/OFF controlled with PU and PD is a switch for developing the square wave in the drive electrode node Sin. When the switch SW1 is made ON with PU, VDD is set to the drive electrode node Sin, and when the switch SW2 is made ON with PD, the electric charge of GND is set to the drive electrode node Sin. PU and PD are usually defined as the non-overlap signals, but a simple inverter logic that inverts the digital signal can be substituted for PU and PD. In the timing chart in FIG. 19, the timing T1 to T6 each show the timing of the edge of the drive signal for when the electric charge transfer from the sensor electrode 2 occurs, but in this example six times the transfer of the electric charge occurs on the rising and falling edges. Then, an example is illustrated in which, in the integral capacitor Cint, the output Aout, which is a value that results from integrating six times the transfer of the electric charge, is measured as the difference with the reference electric potential VR.

First, in the reset sequence, the switch SW1 is made ON with PD and thus the drive electrode node Sin is initialized at GND. At the same time, the switches SWrst and SWf2 are made ON, and thus the electric charge of the integral capacitor Cint is initialized. At this time, a difference in electric potential between both of the terminals of the integral capacitor Cint is VR−GND, and when GND=0, the reference electric potential VR results. The detection node Ain is always set to receive the feedback from the operational amplifier OPA in such a manner that the detection node Ain is always equal to the reference electric potential VR due to a voltage-follow operation of the operational amplifier OPA. Next, the switch SW1 and the switch SWrst are made OFF and thus the reset sequence ends.

In the detection sequence, the switch SW1 is made ON with PU at the timing T1, and thus the drive electrode node Sin is made to transition to VDD and at the same time the switch SWf1 is made ON. Because at this time the operational amplifier OPA keeps the electric potential of the negative input to the same electric potential as the reference electric potential VR and thus performs the negative feedback operation, and because the first electric current output circuit gmA (gm1 and gm2) exchanges the electric charge with the sensor electrode 2, the electric current flows. A specific operation is as follows. The inter-electrode capacitor Cm is stimulated due to the rising edge of the drive signal that appears in the drive electrode node Sin, and changes in the direction in which the voltage of the detection electrode node Ain is increased. The electric potential that is raised at this time corresponds to an amount of accumulated electric charge of the inter-electrode capacitor Cm. When the negative input of the differential amplifier 111 is increased more than the reference electric potential VR, corresponding to a change in voltage of the detection electrode node Ain, the drain electric current of the transconductance element gm2 is increased more than the drain electric current of the transconductance element gm1. When an unbalance occurs between the transconductance element gm1 and the transconductance gm2 in terms of the drain electric current, the electric current equivalent to a difference in the drain electric current between the transconductance element gm1 and the transconductance element gm2 is negatively fed back to the negative input of the differential amplifier 111, through the feedback path 112. Thus, the voltage of detection electrode node Ain drops, and the electric potential of the negative input is returned back to the electric potential the same as the reference electric potential VR. At this time, an amount of electric current that flows from the inter-electrode capacitor Cm through the feedback path 112 and the transconductance gm2 to the ground corresponds to accumulated electric charge of the inter-electrode capacitor Cm that is driven due to the rising edge of the drive signal.

At that time, the second electric current output circuit gmB outputs electric current that depends on the current mirror ratio between the second electric current output circuit gmB and the first electric current output circuit gmA. A specific operation is as follows. In the second electric current output circuit gmB, the drain electric current of the transconductance element gm2' is increased more than the drain electric current of the transconductance element gm1', in the same manner as in the first electric current output circuit gmA. Because one terminal of the integral capacitor Cint is connected to the middle connection point between the transconductance element gm1', and the transconductance element gm2' through the switch SWf1, and furthermore the other terminal of the integral capacitor Cint is connected to the ground through the switch SWf2, electric current flows from the integral capacitor Cint through the transconductance gm2' to the ground. Therefore, a voltage A' that appears at the one terminal of the integral capacitor Cint is electric potential that drops from the reference electric potential VR. The output voltage Aout at this time is GND. In a state where the external noise is not present, an electric potential change ΔA' of A' due to the rising edge of the drive signal can be expressed from the transfer electric charge as in Expression (3). Moreover, the same is true for the electric potential change ΔA' of A' due to the falling edge of the drive signal as well.

$$\Delta A' = B \times VDD \times Cm/Cint \quad (3)$$

B denotes the current mirror ratio between the electric current output circuits gmA and gmB. When the electric current outputs of the first electric current output circuit gmA and the second electric current output circuit are gmB I1 and I2, respectively, B=I2/I1. Thus, an electric potential difference (A'−Aout) between the terminals of the integral capacitor Cint at this time is VR−ΔA'. Next, the switches SWf1 and SWf2 are made OFF, and thus the voltage of the integral capacitor Cint is retained that changed from the reference electric potential VR only by ΔA' of the voltage that is proportional to the electric charge transferred from the sensor electrode 2. Thereafter, the switch SW1 is made OFF with PU.

The switch SW2 is made ON with PD on the next timing T2 and thus the falling edge of the drive signal appears in the drive electrode node Sin. At the same time, the switches Swr1 and SWr2 are made ON and thus the electric charge transfer in the direction opposite to the direction in which the electric charge, when driven on the rising edge at the timing T1, is transferred occurs between the sensor electrode 2 and the electric charge integral circuit 110. A specific operation is as follows. The inter-electrode capacitor Cm is stimulated due to the falling edge of the drive signal that appears in the drive electrode node Sin, and the voltage of the detection electrode node Ain drops in the decreasing direction. The electric potential that is lowered at this time corresponds to that amount of accumulated electric charge of the inter-electrode capacitor Cm. An unbalance occurs in that when the negative input of the differential amplifier 111 is decreased more than the reference electric potential VR, corresponding to the change in voltage of the detection electrode node Ain, the drain electric current of the transconductance element gm1 is increased more than the drain electric current of the transconductance element gm2. The electric current equivalent to the difference in the drain electric current between the transconductance element gm1 and the transconductance element gm2 is negatively fed back to the negative input of the differential amplifier 111 through the feedback path 112. Thus, the voltage of the detection electrode node Ain is raised, and the electric potential of the negative input is returned back to the same electric potential as the reference electric potential VR. At this time, an amount of electric current that flows from the voltage power source through the transconductance element gm1 and the feedback course 112 to the inter-electrode capacitor Cm corresponds to the accumulated electric charge of the inter-electrode capacitor Cm driven due to the falling edge of the drive signal.

At this time, the second electric current output circuit gmB outputs the electric current that depends on the current mirror ratio between the second electric current output circuit gmB and the first electric current output circuit gmA. A specific operation is as follows. In the second electric current output circuit gmB, the drain electric current of the transconductance element gm1' is increased more than the drain electric current of the transconductance element gm2', in the same manner as in the first electric current output circuit gmA. Because the one terminal of the integral capacitor Cint is connected to the voltage power source VDD through the switch SWr2, and the other terminal of the integral capacitor Cint is connected to the middle connection point between the transconductance element gm1' and the transconductance element gm2' through the switch SWr1, the electric current flows from the voltage power source VDD through the transconductance gm1' and the switch SWr1 to the integral capacitor Cint. Thus, because the voltage A' that appears at the one terminal of the integral capacitor Cint is VDD, and is on the falling edge of the drive signal that is applied to the drive electrode node Sin at the timing T2, the output of the electric current conveyor circuit CC changes the output electric voltage Aout that appears at the other terminal of the connected integral capacitor Cint in the raising (positive) direction. In FIG. 19, one arrow on the convergence timing of the output Aout denotes ΔA', convergence electric potential at this time is VDD−VR+2×ΔA'.

After such an operation is further repeated from T3 to T6, in the analog/digital converter 20, the difference in electric potential between the output Aout of the charge amplifier 110 and the reference electric potential VR is analog/digital converted as the electrostatic capacitance measurement value at the timing of the rising edge of the signal AQ.

The size of the inter-electrode capacitor Cm is detected while repeatedly performing this series of the reset sequences and the detection sequences, but according to the present sixth embodiment, even though the external noise is mixed, with regard to the amount of noise electric charge that is temporarily adjacent and thus is introduced into the electric charge integral circuit 110, the noises N1-1, N1-2, and N1-3 and the noises N2-1, N2-2, and N2-3 are offset against one another as illustrated in FIG. 19. Because of this, the voltage after the detection sequence in the integral capacitor Cint that integrates the electric charge that is proportional to that amount of electric charge is a voltage that results from averaging the noise electric charge. Therefore, the influence of the noise can be reduced, particularly in a case of the noise with the low frequency, an effect of reducing the noise can be increased.

Furthermore, the detection sequence is not limited to six times. Within a range in which the electric potential that is output as the output Aout falls into a range of GND and VDD, or within a range at which the circuit can operate, the noise reduction effect is accordingly increased by repeating the detection sequence as many times as possible. Furthermore, it is desirable that the electric charge transfer on the rising of the drive signal be performed the same number of times that the electric charge transfer on the falling is performed. Furthermore, because also in a case where the charge amplifier 10 according to the first embodiment is used, there is freedom in designing the current mirror B between the first electric current output circuit gmA and the second output electric current gmB, the size of the integral capacitor Cint can be decreased by setting the current mirror B, and a circuit size as a whole can be decreased.

Figure 20:
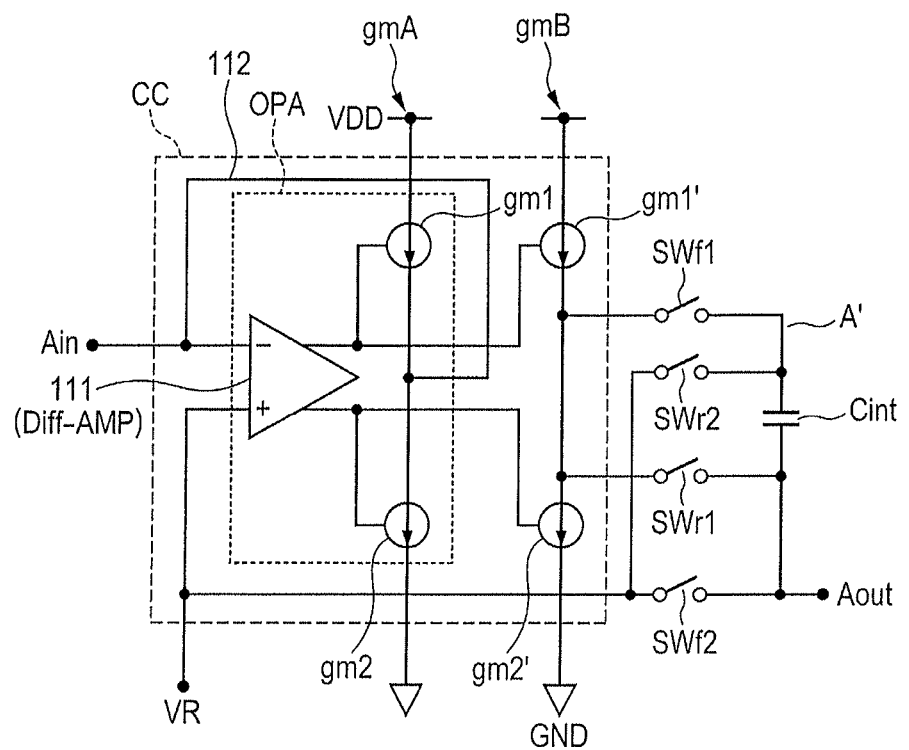
FIG. 20 is a diagram illustrating a modification example of the electric charge integral circuit.

FIG. 20 illustrates a modification example of the electric charge integral circuit. The electric charge integral circuit according to the modification example is the same in basic principle as the electric charge integral circuit 110 (refer to FIG. 18) according to the sixth embodiment, except for a configuration of the selection circuit in which connection points of both of the terminals of the integral capacitor Cint are exchanged. In the electric charge integral circuit 110 according to the sixth embodiment, one terminal of the integral capacitor Cint is configured in such a manner that the one terminal can be connected to the voltage power source VDD through the switch SWr2, and the other terminal is configured in such a manner that the other terminal can be connected to the ground GND through the switch SWf2, but according to the present modification example, both terminals of one end of the integral capacitor Cint are also configured in such a manner that the both terminals can be connected to the reference electric potential VR through the switch SWf2 and the switch SWr2.

Figure 21:
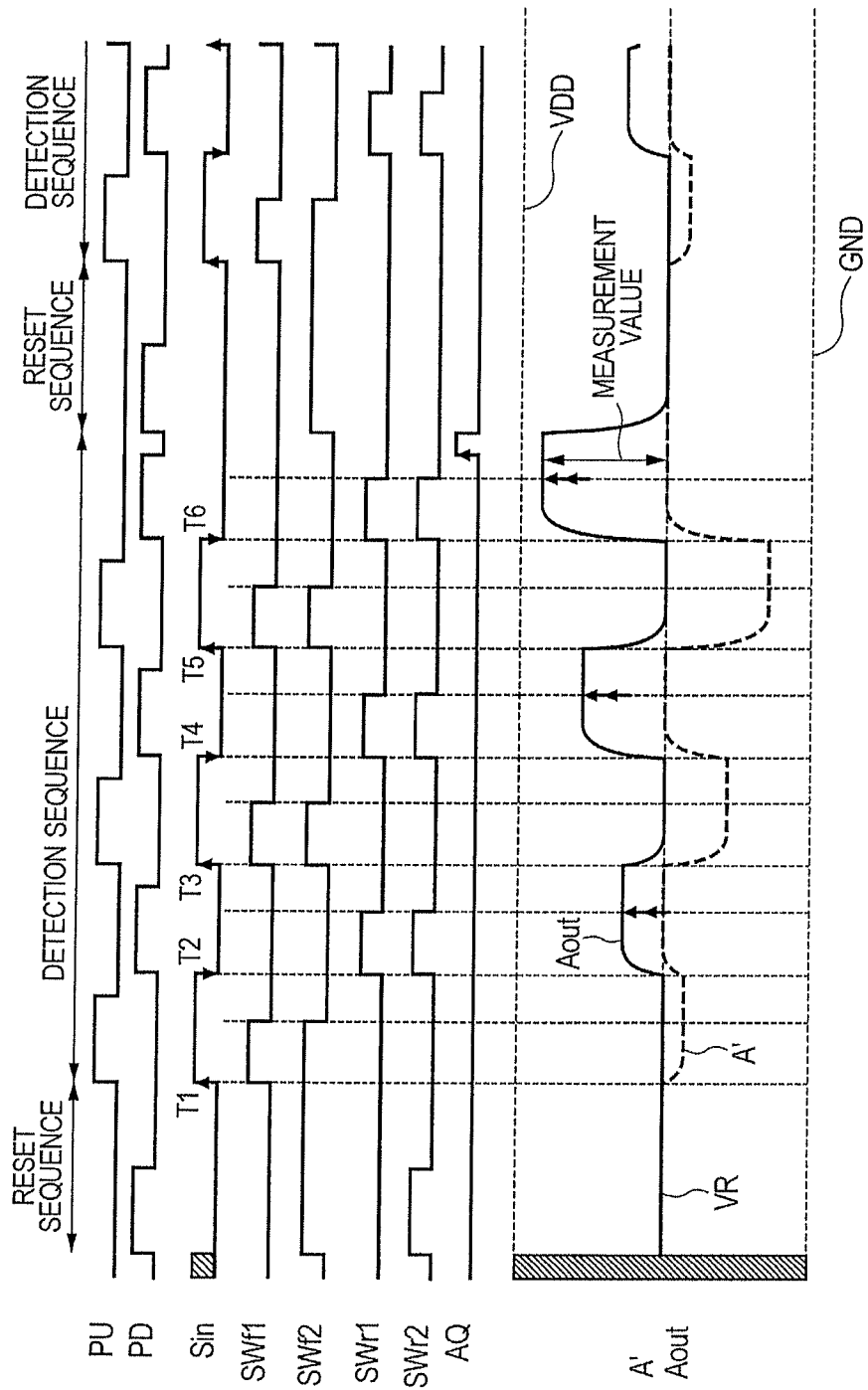
FIG. 21 is a timing chart illustrating operation timing of the electric charge integral circuit according to the modification example in FIG. 20.

FIG. 21 is a timing chart illustrating operation timing when using the electric charge integral circuit according to the modification example. According to the modification example, in the reset sequence, the switch SWf2 and the switch SWr2 are made OFF and thus any one of terminals of both ends of the integral capacitor Cint is connected to the reference electric potential VR and thus is initialized.

Furthermore, the integral operation on each of the timing T1, T2 and so forth is the same as the operation in the specific example of the electric charge integral circuit 110 illustrated FIG. 18, except that the terminal in the direction opposite to the direction in which the integral capacitor Cint is connected to the electric current conveyor circuit CC is connected to the reference electric potential VR. For example, at the timing T1, the switch SWf1 is made ON and thus one terminal of the integral capacitor Cint is connected to the output (the middle connection point between the transconductance element gm1' and the transconductance element gm2') of the electric current conveyor circuit CC and, because the switch SWf2 remains ON, the other terminal of the integral capacitor Cint is connected to the reference electric potential VR. Furthermore, at the timing T2, the switch SWr1 is made ON and thus the other terminal of the integral capacitor Cint is connected to the output (the middle connection point between the transconductance element gm1' and the transconductance element gm2') of the electric current conveyor circuit CC, and the switch SWr2 is made ON and thus one terminal of the integral capacitor Cint is connected to the reference electric potential VR.

According to such a modification example, one switch SWrst can be saved compared to the electric charge integral circuit 110 according to the sixth embodiment.

Seventh Embodiment

Next, a seventh embodiment of the present invention is described. The present seventh embodiment, like the fourth embodiment, is an embodiment that results from realizing the delta sigma type analog/digital converter, as the analog/digital converter 20, which uses the comparator that outputs one bit. The electric charge integral circuit 110 can employ the same configuration as in FIG. 18 according to the sixth embodiment, or as in the modification example (refer to FIG. 20).

Figure 22:
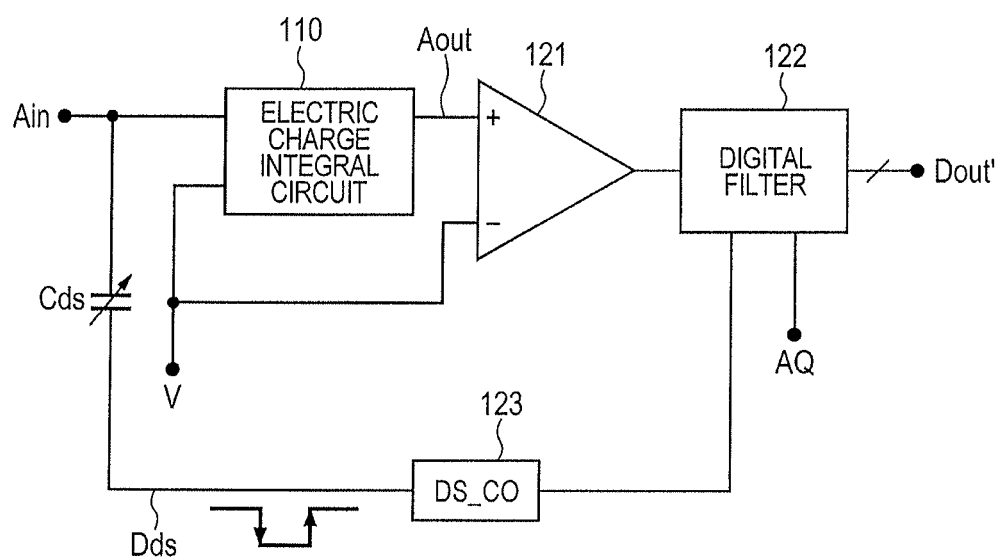
FIG. 22 is a diagram of a configuration example of the analog/digital converter that is applied to a seventh embodiment.

FIG. 22 illustrates a configuration example of the analog/digital converter 20 that is applied to the present seventh embodiment. The analog/digital converter 20 has a comparator 121, outputting one bit, which compares the output Aout of the electric charge integral circuit 110 and the reference electric potential VR, a digital filer 122 that converts the output of the comparator 121 into a multi bit output Dout' with digital filtering processing while latching the output of the comparator 121 with the signal AQ, and a delta sigma feedback control logic 123 that controls feedback timing of the delta sigma feedback capacitor Cds. An output of the comparator 121 is fed back to the input through the delta sigma feedback capacitor Cds, and thus the delta sigma modulation is performed. The feedback timing of the delta sigma feedback capacitor Cds is controlled with the delta sigma feedback control logic 123.

Figure 23:
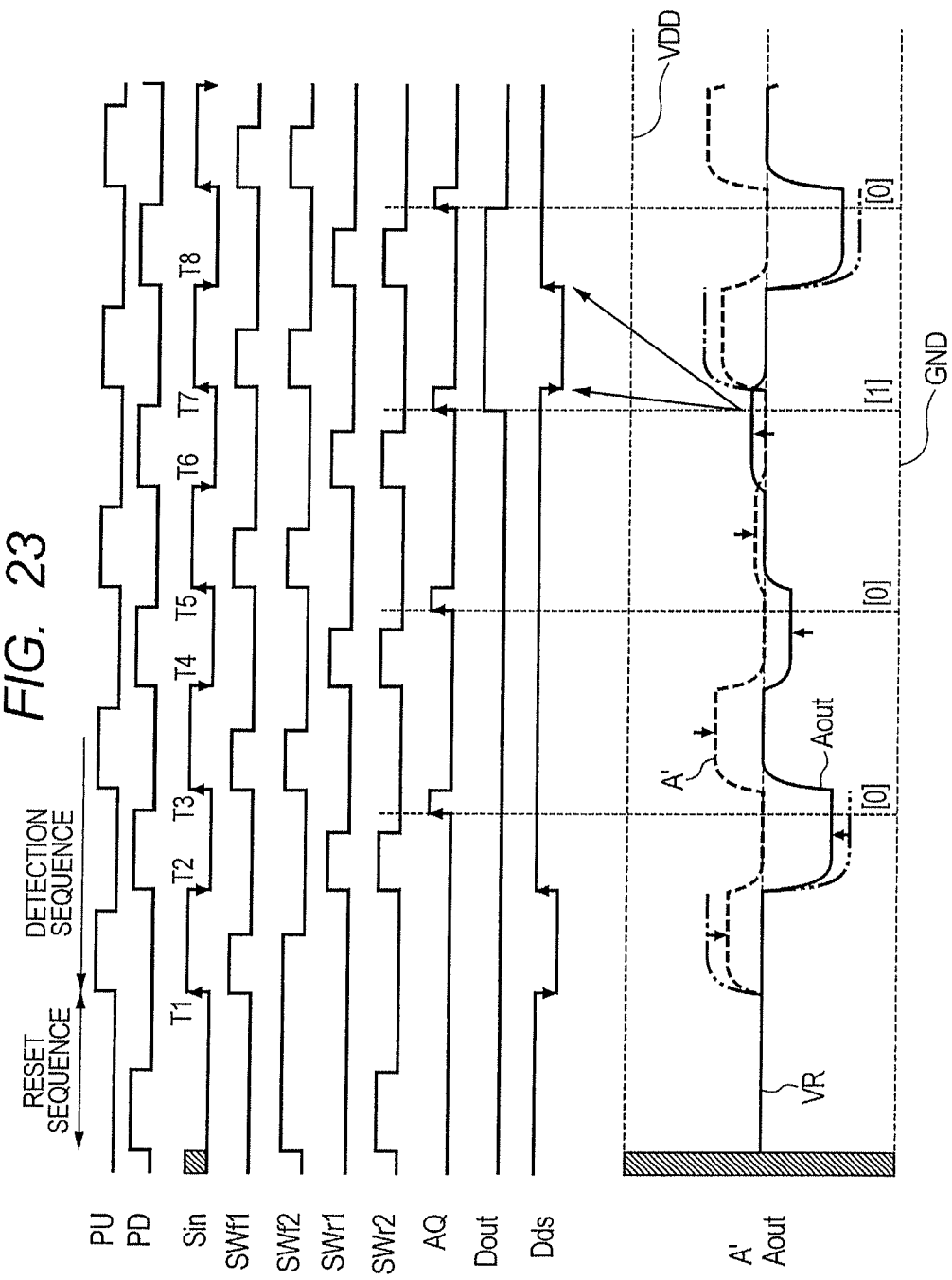
FIG. 23 is a timing chart for describing an operation of the seventh embodiment.

FIG. 23 is a timing chart illustrating the electrostatic capacitance detection circuit according to the present seventh embodiment. The timing chart exemplifies a case where the modification example (refer to FIG. 20) according to the sixth embodiment is adopted as the electric charge integral circuit. Moreover, operations of generating the drive signal and introducing the electric charge from the sensor electrode 2 into the electric charge integral circuit 110 are the same as in the modification example according to the sixth embodiment.

In the reset sequence, steps involving up to the initialization of the electric charge of the integral capacitor Cint by making PD and the switch SWf2 ON are the same as in the modification example according to the sixth embodiment. In the detection sequence that is subsequently performed, in the integral operation on both of the rising and falling edges of the first drive signal at the timing T1 and T2, the signal Dds changes in the direction opposite to the direction of the drive signal and thus the initial electric charge is transferred to the electric charge integral circuit 110. At this time, the electric charge transfer due to the drive signal occurring in the drive electrode node Sin is also performed at the same time. Due to the change in the signal Dds, an initial electric charge Qds that is transferred with respect to the integral capacitor Cint through the delta sigma feedback capacitor Cds, corresponding to the initial one edge of the signal Dds is expressed in Expression (4).

$$Qds = VDD \times Cds \times B \quad (4)$$

B is the current mirror ratio between the first and second electric current output circuits gmA and gmB as in the sixth embodiment. An output waveform of the output Aout that corresponds to the electric charge thereof is indicated by a two dotted line in FIG. 23, but is indicated by a dashed-line waveform A' because the electric charge is deducted in an arrow direction due to the electric charge transferred by the drive signal that is applied to the drive electrode node Sin. Such an operation is performed on the next edge, that is, the falling edge, of the drive signal, in the same manner and because the initial electric charge is transferred due to the signal Dds to the integral capacitor Cint on both of the edges at the timing T1 and T2, doubled electric charge that is calculated in total in Expression (4) is transferred as the initial electric charge.

Because the electric charge that corresponds to the inter-electrode capacitor Cm of the sensor electrode 2 is transferred with the drive signal on the edges at the timing T1 to T5, the electric charge is transferred in the state of being deducted from the initial electric charge of the integral capacitor Cint and the output of the electric charge integral circuit 110 is made to approach the reference electric potential VR. The signal AQ rises after completing the electric charge transfer with one set of the rising and the falling of the edge of the drive signal as one unit, and thus a comparison result signal (one bit) that represents a result of the comparator 121 making a comparison between the output Aout of the electric charge integral circuit 110 and the reference electric potential VR, while being introduced into the digital filter 122, is converted into the multi bit output Dout' with digital filtering processing using a FIR filter, and the result of the conversion is output. A value that results from the digital filter 122 latching the result of the comparison by the comparator 121 with the signal AQ is shown on the lower part of the output Aout (refer to FIG. 23).

After the electric charge is transferred with the drive signal on the falling edge at the timing T6, the output Aout of the electric charge integral circuit 110 is increased more than the reference electric potential VR. At this time, at the timing for when the output of the comparator 121 is HIGH and the signal AQ rises, the digital filter 122 latches "1". Information thereon is transmitted to the delta sigma feedback control logic 123, and signal Dds is fed back as the feedback signal of the delta sigma modulation at the timing T7 of the rising edge of the next drive signal and at the timing T8 of the falling edge of the next drive signal. Furthermore, the gain of the output digital value can be adjusted by changing the size of the delta sigma feedback capacitor Cds.

The electrostatic capacitance detection circuit can be configured to include the analog/digital converter with high resistance to the noise, with a simple configuration in which, as in this series of operations, the electric charge integral operation is performed in the state in which the electric charge depending on the size of the inter-electrode capacitor Cm is deducted with the drive signal from the initial electric charge, and through the delta sigma feedback capacitor Cds, the electric charge that depends on a capacitance value thereof feeds back the result of the output by the comparator 121.

Moreover, the electric current conveyor circuit CC according to the sixth and seventh embodiments described above has a configuration in which the second electric current output circuit gmB is arranged at the back of the operational amplifier OPA, and the differential amplifier 111 is commonly used, but the present invention is not limited to this circuit configuration.

Figure 24:
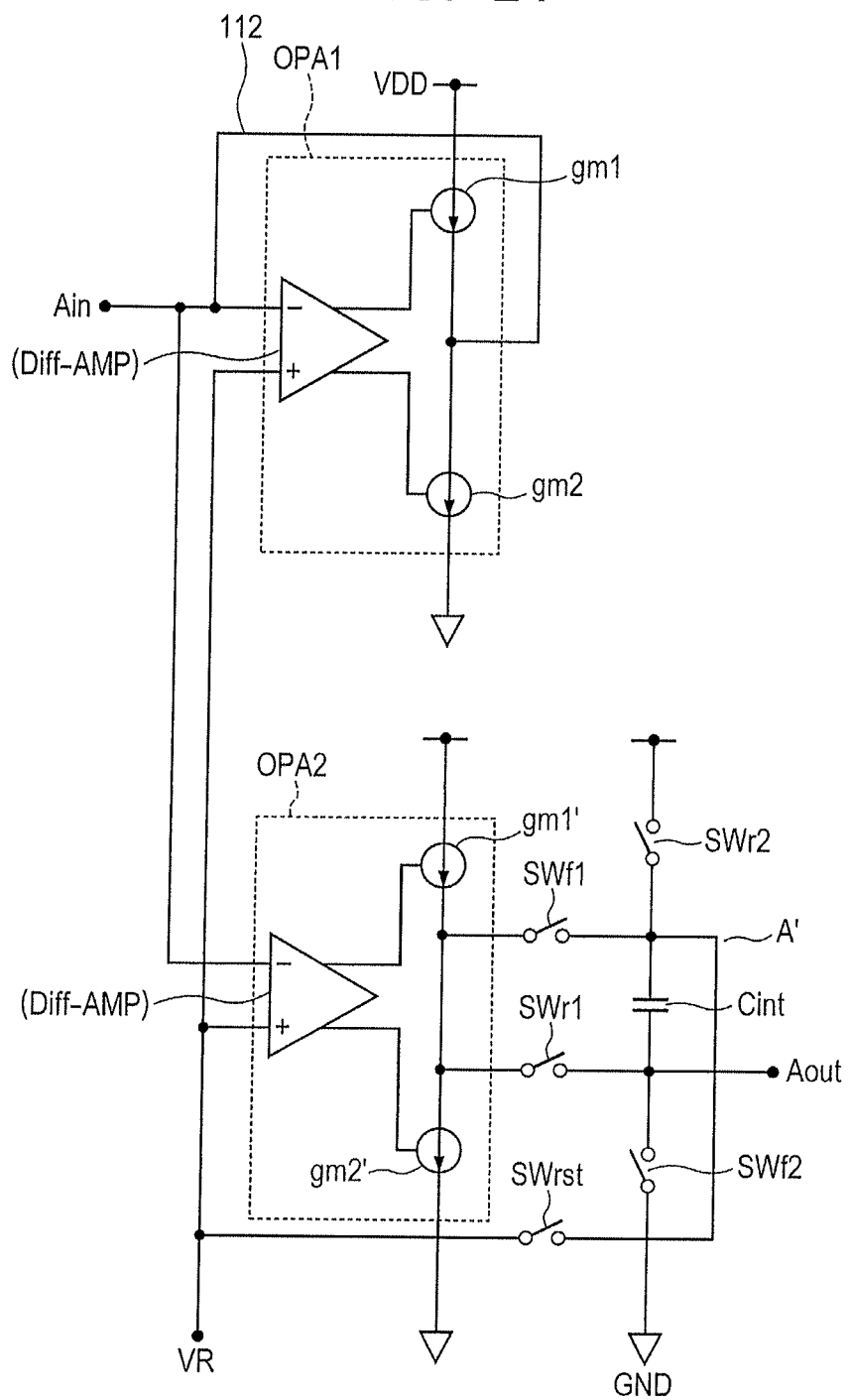
FIG. 24 is a diagram illustrating a configuration example in which an input unit of the electric charge integral circuit is doubled in number.

For example, as illustrated in FIG. 24, a configuration for doubling an input unit of the electric charge circuit 110 in number may be possible that includes an operational amplifier OPA1 for applying the feedback to an input terminal of the electric charge integral circuit 110 and an operational amplifier OPA2 for accumulating the electric charge in the integral capacitor Cint. The same as the operational amplifier OPA illustrated in FIG. 18 may be used as the operational amplifiers OPA1 and OPA2. Other constituent elements are given the same reference numerals as those of the constituent elements of the electric current integral circuit 110 illustrated in FIG. 18. In this manner, even though the configuration is employed in which the operational amplifier OPA1 for applying the feedback to the input terminal of the electric charge integral circuit 110 and the operational amplifier OPA2 for accumulating the electric charge in the integral capacitor Cint are separately provided, the same as the operational effect according the sixth and seventh embodiments can be accomplished.

Moreover, the present invention is not limited to the embodiments described above, and various modifications are possible. In the embodiments described above, the size and the shape of the sensor electrode are not limited to those illustrated in the accompanying drawings, and proper modifications are possible within a scope in which the effect of the present invention is accomplished. In addition, the proper modifications are possible that do not deviate from a range of the object of the present invention.

It should be understood by those skilled in the art that various modifications, combinations, sub-combinations and alterations may occur depending on design requirements and other factors insofar as they are within the scope of the appended claims of the equivalents thereof.

What is claimed is:

1. An electrostatic capacitance detection circuit comprising;
   a drive electrode and a detection electrode that constitute a sensor;
   an electric charge integral circuit into which a signal including detection electric charge of an inter-electrode capacitance formed between the drive electrode and the detection electrode, and electric charge due to an external noise flows, wherein the electric charge integral circuit includes a capacitor that accumulates the electric charge transferred from the inter-electrode capacitance, and continuously integrates the electric charge transferred due to a drive signal applied to the drive electrode, in the capacitor;
   wherein the electric charge integral circuit includes;

a charge amplifier that has an operational amplifier in which the capacitor is provided on a feedback path, and a plurality of selection switches, each switching a direction of the drive signal applied to the capacitor, and wherein a voltage selection switch that switches rising or falling of the drive signal applied to the drive electrode and a feedback path selection switch that switches a path capacitor provided in the feedback path are controlled at the same time according to the rising falling of the drive signal; and an A/D converter that converts an output of the electric charge integral circuit from an analog into a digital signal.

2. The electrostatic capacitance detection circuit according to claim 1, further comprising:

a catch switch that controls a period during which the drive signal flows into the charge amplifier, wherein the analog signal that becomes an output of the charge amplifier due to the catch switch is caught in accord with the timing of analog/digital conversion.

3. The electrostatic capacitance detection circuit according to claim 1, wherein one of a resistance element, an impedance element, an active element, and a circuitry that is a combination of the impedance element and the active element is connected in parallel with respect to the feedback path of the operational amplifier.

4. The electrostatic capacitance detection circuit according to claim 1, wherein the A/D converter converts the analog signal that is made from a difference in electric potential between output electric potential of the charge amplifier and reference electric potential into the digital signal.

5. The electrostatic capacitance detection circuit according to claim 4, further comprising:

a feedback circuit that generates a feedback signal based on the digital signal to be applied to the drive electrode in the capacitor, wherein the feedback signal results from converting the analog signal made from the difference in electric potential between the output electric potential of the charge amplifier and the reference electric potential into the digital signal, and wherein the feedback circuit feeds the feedback signal to the charge amplifier.

6. The electrostatic capacitance detection circuit according to claim 1, wherein the A/D converter converts the analog signal that is made from a difference in electric potential between output electric potential of the charge amplifier that corresponds to a rising edge of the drive signal and the output electric potential of the charge amplifier that corresponds to a falling edge of the drive signal, into the digital signal.

7. The electrostatic capacitance detection circuit according to claim 6, further comprising:

a feedback circuit that generates a feedback signal based on the digital signal to be applied to the drive electrode in the capacitor, wherein the feedback signal results from converting the analog signal made from the difference in electric potential between the output electric potential of the charge amplifier that corresponds to a rising edge of the drive signal and the output electric potential of the charge amplifier that corresponds to a falling edge of the drive signal into the digital signal, and wherein the feedback circuit feeds the feedback signal to the charge amplifier.

8. The electrostatic capacitance detection circuit according to claim 1, wherein the electric charge integral circuit further includes:

an electric current conveyor circuit that has a differential amplifier to which electric potential of the detection electrode of the sensor and reference electric potential are input, a first electric current output circuit of which output electric current is controlled with an output voltage of the differential amplifier, a feedback path through which output electric current of the first electric current output circuit is fed back to an input of the differential amplifier, and a second electric current output circuit that makes up a current mirror configuration, in company with the first electric current output circuit; and a selection circuit that initializes electric potential of the capacitor integrating output electric current of the second electric current output circuit, and switches an output of the electric current conveyor circuit and connection to the capacitor depending on a direction of electric charge that flows in from the detection electrode of the sensor.

9. The electrostatic capacitance detection circuit according to claim 8, wherein the selection circuit includes:

a first switch that is connected between an output of the second electric current output circuit and one terminal of the capacitor, a second switch that is connected between an output of the second electric current output circuit and the other terminal of the capacitor, a third switch that is connected between the other terminal of the capacitor and ground, a fourth switch that is connected between one terminal of the capacitor and a power source, and a fifth switch that is connected between a reference electric potential terminal and one terminal of the capacitor.

10. The electrostatic capacitance detection circuit according to claim 8, wherein the selection circuit includes:

a first switch that is connected between an output of the second electric current output circuit and one terminal of the capacitor, a second switch that is connected between an output of the second electric current output circuit and the other terminal of the capacitor, a third switch that is connected between the other terminal of the capacitor and a reference electric potential terminal, and a fourth switch that is connected between one terminal of the capacitor and the reference electric potential terminal.

11. The electrostatic capacitance detection circuit according to claim 8, wherein the operational amplifier in the electric charge integral circuit further includes:

a first operational amplifier that has a first differential amplifier to which electric potential of a detection electrode of the sensor electrode and reference electric potential are input, a first electric current output circuit of which output electric current is controlled with an output voltage of the first differential amplifier, and a feedback path through which output electric current of the first electric current output circuit is fed back to an input of the first differential amplifier;

a second operational amplifier that has a second differential amplifier to which the electric potential of the detection electrode of the sensor electrode and the reference electric potential are input, and a second electric current output circuit of which output electric current is controlled with an output voltage of the second differential amplifier; and the selection circuit initializes electric potential of the capacitor integrating output electric current of the second electric current output circuit, and switches an output of the second operational amplifier and connection to the capacitor depending on a direction of electric charge that flows in from the detection electrode of the sensor electrode.

12. The electrostatic capacitance detection circuit according to claim 1, wherein the A/D converter comprises a delta sigma type converter.

13. An input device comprising:

A sensor comprising a drive electrode and a detection electrode; and an electrostatic capacitance detection circuit connected to the sensor, the electrostatic capacitance detection circuit comprising:

an electric charge integral circuit into which a signal including detection electric charge of an inter-electrode capacitance of both the drive electrode and the detection electrode, and electric charge due to an external noise flows, wherein the electric charge integral circuit includes a capacitor that accumulates the electric charge transferred from the inter-electrode capacitance, and continuously integrates the electric charge transferred due to a drive signal applied to the drive electrode in the capacitor;

wherein the electric charge integral circuit includes:

a charge amplifier that has an operational amplifier in which the capacitor is provided on a feedback path, and a plurality of selection switches, each switching a direction of the drive signal applied to the capacitor, and wherein a voltage selection switch that switches rising or falling of the drive signal applied to the drive electrode and a feedback path selection switch that switches a path of the capacitor provided in the feedback path are controlled at the same time according to the rising and falling of the drive signal; and an A/D converter that converts an output of the electric charge integral circuit from an analog signal into a digital signal.

* * * * *